(12) United States Patent
Inoue et al.

(10) Patent No.: US 7,825,515 B2
(45) Date of Patent: Nov. 2, 2010

(54) SEMICONDUCTOR DEVICE, DISPLAY DEVICE, AND METHOD OF MANUFACTURING SEMICONDUCTOR DEVICE

(75) Inventors: Kazunori Inoue, Tokyo (JP); Nobuaki Ishiga, Kumamoto (JP); Kensuke Nagayama, Kumamoto (JP); Naoki Tsumura, Kumamoto (JP); Takumi Nakahata, Tokyo (JP); Kazumasa Kawase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/206,187

(22) Filed: Sep. 8, 2008

(65) Prior Publication Data

US 2009/0065942 A1 Mar. 12, 2009

(30) Foreign Application Priority Data

Sep. 12, 2007 (JP) .............................. 2007-236353

(51) Int. Cl.
*H01L 23/48* (2006.01)
(52) U.S. Cl. .............................. 257/765; 257/E23.141; 257/59
(58) Field of Classification Search ................... 257/59, 257/72, 79, 83–85, 88, 94, 96, 97, E51.018, 257/741, 765, 758, 766, 768
See application file for complete search history.

(56) References Cited

U.S. PATENT DOCUMENTS

| 2004/0022664 A1 | 2/2004 | Kubota et al. |
| 2004/0126608 A1 | 7/2004 | Gotoh et al. |
| 2007/0040172 A1 | 2/2007 | Kawakami et al. |
| 2008/0272685 A1* | 11/2008 | Ikeda et al. ................. 313/496 |

FOREIGN PATENT DOCUMENTS

| JP | 62-240735 | 10/1987 |
| JP | 62-240738 | 10/1987 |
| JP | 6-236893 | 8/1994 |
| JP | 7-30118 | 1/1995 |
| JP | 8-62628 | 3/1996 |
| JP | 2003-89864 | 3/2003 |
| JP | 2004-214606 | 7/2004 |
| JP | 2008-10801 | 1/2008 |
| JP | 2008-108975 | 5/2008 |

* cited by examiner

*Primary Examiner*—Charles D Garber
*Assistant Examiner*—Hoa B Trinh
(74) *Attorney, Agent, or Firm*—Oblon, Spivak, McClelland, Maier & Neustadt, L.L.P.

(57) ABSTRACT

A semiconductor device includes a film containing silicon as the main ingredient, and an aluminum alloy film, such as a source electrode and a drain electrode, that is directly connected to the film containing silicon as the main ingredient, such as an ohmic low-resistance Si film, and contains at least Al, Ni, and N in the vicinity of the bonding interface. The Aluminum alloy film has a good contact characteristic when directly connected to the film containing silicon as the main ingredient without having a barrier layer formed of high melting point metal.

10 Claims, 21 Drawing Sheets

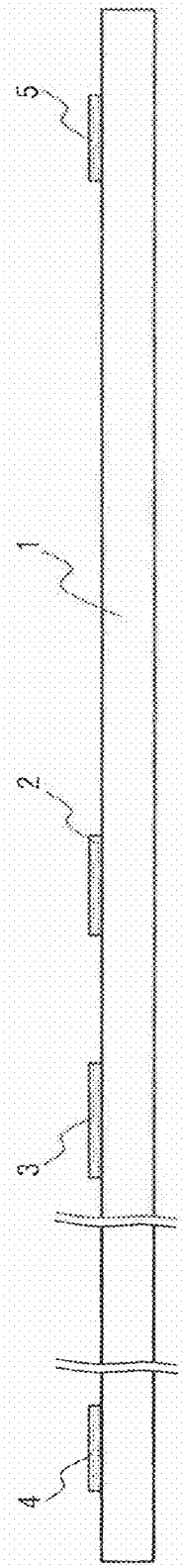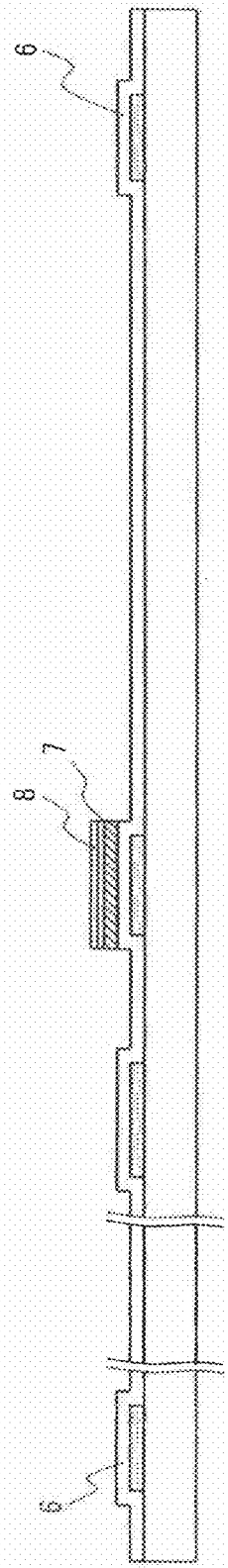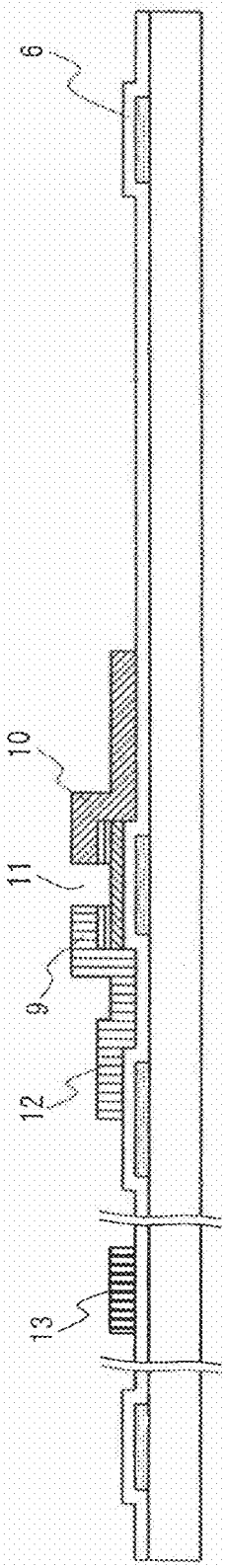

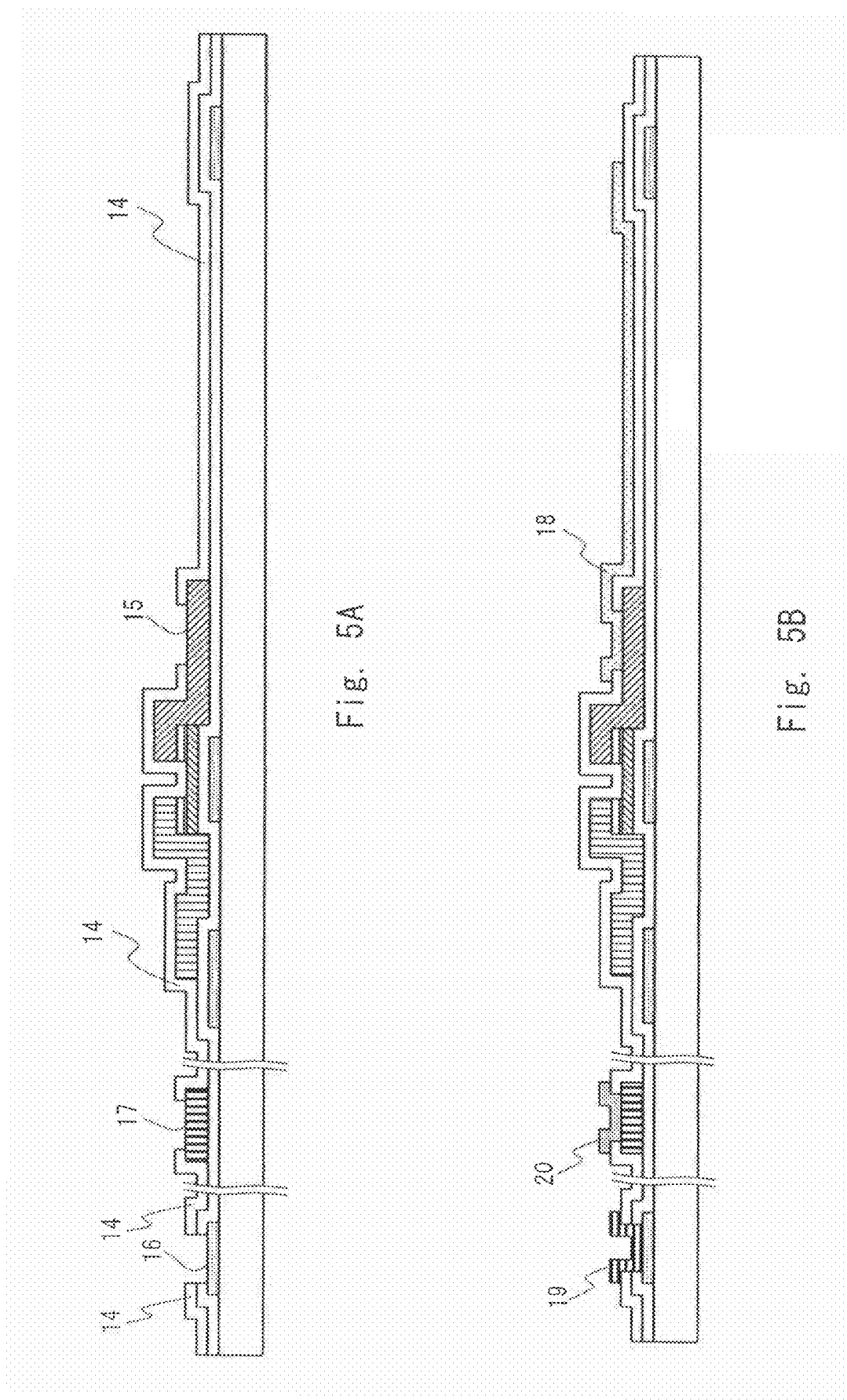

SEMICONDUCTOR DEVICE, DISPLAY DEVICE, AND METHOD OF MANUFACTURING SEMICONDUCTOR DEVICE

BACKGROUND OF THE INVENTION

1. Field of the Invention

The present invention relates to the structure of a semiconductor device used for electrooptic display devices such as liquid crystal display devices and organic EL (electroluminescence) display devices and other semiconductor components, and a method of manufacturing the same. In particular, the present invention relates to the structure of a semiconductor device including an aluminum alloy film (which is denoted by "Al alloy film" hereinafter), and either a Si film (silicon film) or a film containing Si as the main ingredient, as constituent elements of the semiconductor device, and a method of manufacturing the same.

2. Description of Related Art

An electrooptic display device with active matrix type TFTs in which thin film transistors (which are denoted by "TFTs" hereinafter) are used as the switching elements has been known as an example of semiconductor devices, and has increasingly found application as one of alternative flat panel display devices to the CRTs (Cathode Ray Tubes) in products in which the advantageous features of the electrooptic display devices such as low power consumption and low profile are fully exploited.

Conventionally, the so-called high melting point metal material such as titan (Ti), chromium (Cr), molybdenum (Mo), tantalum (Ta), tungsten (W), and alloys having these metals as the main ingredients has been used as typical material for wirings and electrodes that constitute a semiconductor device. These high melting point metals have almost no interfacial diffusion reaction in the bonding interface with the Si semiconductor film, and therefore have been suitably used as electrode material for semiconductor devices. However, as TVs have been becoming larger and the resolution of compact displays such as the displays of mobile phones has been becoming higher in recent years, the need to reduce the electrical resistance of wiring material has arisen. As a result, the specific resistance of high melting point metal (in general, 12 to 60 $\mu\Omega\cdot cm$) has no longer been considered to be sufficient. Consequently, aluminum (Al), which has low specific resistance and is easy to make wiring pattern, or Al alloy films composed of alloys containing Al as the main ingredients have become a focus of attention as the wiring material for display devices.

However, Al alloy films, in general, have been known to cause strong interdiffusion reactions in the bonding interface with a Si semiconductor film or a film containing Si as the main ingredient and thus to deteriorate electrical characteristics. Therefore, when an Al alloy film is to be connected to a Si film, the Al alloy film needs to be connected to it with above-mentioned high melting point metal interposed therebetween as a barrier layer. Furthermore, in the case of an optical display device for use in display apparatuses, wiring material (e.g., Al alloy film) needs to be connected to indium oxide group typically used as transparent pixel electrode material such as ITO (Indium Tin Oxide), which is prepared by combining indium oxide and tin oxide. As with the previous case, the Al alloy film also needs to be connected to the ITO with high melting point metal interposed therebetween as a barrier layer because the Al alloy film causes diffusion reactions in the interface with the ITO in such cases.

Examples of such structures in which above-mentioned high melting point metals are used as the barrier layers and applied to the source and drain electrodes of TFTs in combination with low-resistance Al alloy films are disclosed in Japanese Unexamined Patent Application Nos. 6-236893, 7-30118, and 8-62628. These examples have stacked-layer structures in which high melting point metals of Cr, Mo, Ti, and Zr are provided in the lower layer and connected directly to a low-resistance Si film to which impurities are added (ohmic contact Si film) and to an ITO film, and then low-resistance Al group metal is formed in the upper layer.

Meanwhile, Japanese Unexamined Patent Application Nos. 2003-89864 and 2004-214606 disclose methods for achieving better electrical characteristics in the interfaces (contact characteristics) by preventing interfacial diffusion reactions between Al alloy films and ITOs. These methods eliminate the need for the barrier layer of the high melting point metal at least in devices in which the Al alloy films need to be directly connected only with ITOs.

As described above, since interfacial diffusion reactions with Si semiconductor films and Si films containing Si as the main ingredients could not be prevented by the combination of conventional Al alloy films and manufacturing processes in the related art, the barrier layer of high melting point metal has had to be formed. As a result, the number of processes including a film-forming process and an etching process has increased, resulting in the decrease in the productivity. Furthermore, the difference in etching rates, the difference in side etching amounts in the lateral direction between the Al alloy film and the high melting point metal, and similar factors during the etching process have caused unevenness in the cross-sectional structure processed by the etching. As a result, micro-fabrication processes have been very difficult.

In addition, the unevenness in the cross-sectional structure processed by the etching has also deteriorated the coverage characteristic of the film formed in their upper layer. As stated above, Al alloy films and manufacturing methods in the related art have a problem that manufacturing semiconductor devices having high quality and high reliability has been very difficult and so forth.

Incidentally, the above-mentioned Japanese Unexamined Patent Application No. 2003-89864 also describes an improvement effect on the contact characteristic with Si in addition to the contact characteristic with ITO. According to evaluations conducted by the inventors of the present application in which Al alloy films were directly formed on Si semiconductors as the source and drain electrodes of TFTs using Si semiconductors, no interdiffusion reaction was observed in the interface with Si immediately after the film formation. However, the diffusion reactions had gradually proceeded with the heat treatment (it was maintained for about 30 minutes in the ambient atmosphere or nitrogen gas atmosphere), and they had proceeded to such extent at a temperature above 250° C. that the diffusion reactions could be observed even by an optical microscope or the like. Furthermore, although any remarkable diffusion reaction was not obverted by an optical microscope or the like at a temperature above 200° C., obvious deterioration in TFT characteristics, in particular, in a typical on/off characteristic of Id (drain current)–Vg (gate voltage) was observed by the measurements of TFT electrical characteristics. Typical manufacturing processes of active matrix TFT array substrates involve processes that are carried out, to say the least, at a temperature of 200° C. or higher. Therefore, there has been a problem that the application to such semiconductor devices has been practically impossible in terms of heat resistance.

One of the objects of the present invention is to provide an Al alloy film capable of achieving an excellent contact characteristic with a Si film or a film containing Si as the main ingredient without forming a barrier layer of high melting point metal, and a method of manufacturing the same.

SUMMARY OF THE INVENTION

In accordance with one aspect of the present invention, a semiconductor device includes: a film containing silicon (Si) as the main ingredient; and an aluminum alloy film directly connected to the film containing Si as the main ingredient, the aluminum alloy film containing at least Al, nickel (Ni), and nitrogen (N) in the vicinity of the bonding interface. Furthermore, in accordance with another aspect, the present invention provides a display device using such semiconductor devices.

Furthermore, in accordance with another aspect of the present invention, a method of manufacturing a semiconductor device includes: a process for forming a film containing Si as the main ingredient; and a process for forming an aluminum alloy film such that the aluminum alloy film is directly connected to the film containing Si as the main ingredient and contains at least Al, Ni, and N in the vicinity of the bonding interface with the film containing Si as the main ingredient. Furthermore, in accordance with another aspect of the present invention, a method of manufacturing a semiconductor device includes: a process for forming an aluminum alloy film such that the aluminum alloy film contains at least Al, Ni, and N in the vicinity of the bonding interface with a film stacked on the aluminum alloy film; and a process for forming a film containing Si as the main ingredient such that the film containing Si as the main ingredient is directly connected to at least a part of the surface of the bonding interface of the aluminum alloy film.

The present invention can provide an Al alloy film capable of achieving an excellent contact characteristic with a Si film or a film containing Si as the main ingredient without forming a barrier layer of high melting point metal, and a method of manufacturing the same.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIGS. 4A, 4B, and 4C are cross sectional views showing processes of the manufacturing process of an active matrix TFT array substrate for use in a display apparatus in accordance with the first embodiment of the present invention;

FIGS. 5A and 5B are cross sectional views showing processes of the manufacturing process of the active matrix TFT array substrate for use in a display apparatus in accordance with the first embodiment of the present invention;

in FIG. 21A and FIG. 21B respectively;

in FIG. 22A and FIG. 22B respectively; in FIG. 23A and FIG. 23B respectively.

DESCRIPTION OF THE PREFERRED EMBODIMENTS

Figure 1:
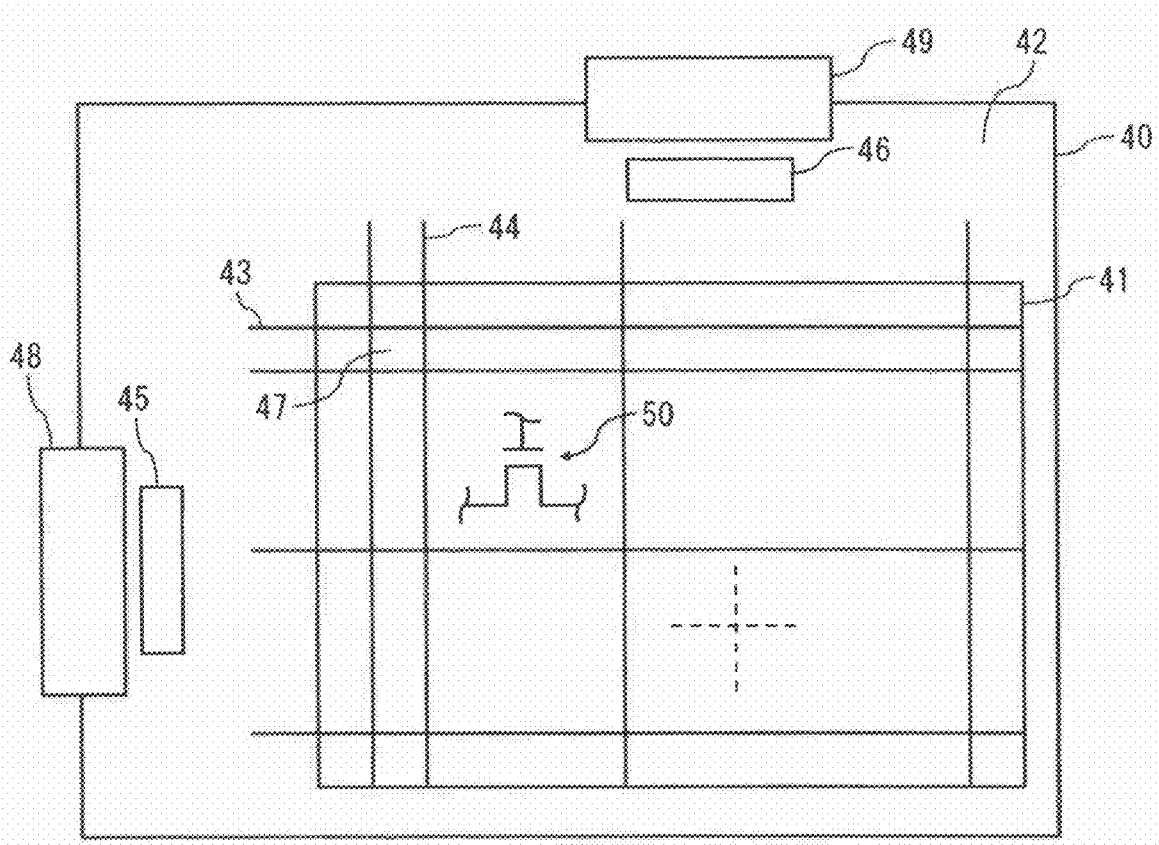
FIG. 1 is a front view showing an example of the structure of a TFT active matrix substrate for use in an electrooptic display device.

Embodiments of the present invention are explained hereinafter with reference to the drawings. In the following descriptions and the drawings, some nonessential parts are omitted or simplified as appropriate in order to clarify the explanations. In the drawings, the same signs are assigned to identical or equivalent components and components having identical or equivalent functions, and explanations of them are omitted as appropriate.

Firstly, an example of a display device using a semiconductor device in accordance with one example of the present invention is explained hereinafter with reference to FIG. 1. FIG. 1 is a front view showing an example of the structure of a TFT array substrate for use in a display device. While a liquid crystal display device is explained as an example of the display device in the following embodiments, the explanation is made only for the illustrative purpose. For example, other flat panel display devices, such as an organic electroluminescence display device can be used as a substitute for the liquid crystal display device.

A liquid crystal display device shown in FIG. 1 has a substrate 40. The substrate 40 is, for example, an array substrate such as a TFT array substrate. A display area 41 and a frame area 42 surrounding the display area 41 are provided on the substrate 40. A plurality of gate lines (scanning signal lines) 43 and a plurality of source lines (display signal lines) 44 are formed in the display area 41. The plurality of gate lines 43 are arranged in parallel with each other. Similarly, the plurality of source lines 44 are arranged in parallel with each other. The gate line 43 and the source line 44 are formed such that they intersect with each other. The gate line 43 and the source line 44 intersect at right angles with each other. The area defined by adjacent gate lines 43 and source lines 44 becomes a pixel 47. Consequently, the pixels 47 are arranged in matrix in the substrate 40.

A scanning signal drive circuit 45 and a display signal drive circuit 46 are provided in the frame area 42 of the substrate 40. The gate line 43 extends from the display area 41 into the frame area 42, and connects to the scanning signal drive circuit 45 at the edge portion of the substrate 40. Similarly, the source line 44 extends from the display area 41 into the frame area 42, and connects to the display signal drive circuit 46 at the edge portion of the substrate 40. An external wiring 48 is connected near the scanning signal drive circuit 45. Furthermore, an external wiring 49 is connected near the display signal drive circuit 46. The external wiring 48 and 49 are, for example, wiring boards such as FPCs (Flexible Printed Circuits).

Various external signals are supplied to the scanning signal drive circuit 45 and the display signal drive circuit 46 through the external wirings 48 and 49. The scanning signal drive circuit 45 supplies a gate signal (scanning signal) to the gate line 43 based on the external control signal. The gate lines 43 are sequentially selected by this gate signal. The display signal drive circuit 46 supplies a source signal to the source line 44 based on the external control signal or external display data. In this manner, display voltage corresponding to the display data can be supplied to the pixel 47.

At least one TFT 50 is formed in the pixel 47. The TFT 50 is located near the intersection of the source line 44 and the gate line 43. For example, the TFT 50 supplies a display voltage to a pixel electrode. That is, the TFT 50, which is a switching element, is turned on by a gate signal from the gate line 43. In this manner, the display voltage is applied from the source line 44 to the pixel electrode that is connected to a drain electrode of the TFT 50. An electric field corresponding to the display voltage is produced between the pixel electrode and an opposed electrode. Incidentally, an alignment layer (not shown) is formed on the surface of the substrate 40.

Furthermore, an opposed substrate is arranged opposite to the substrate 40. The opposed substrate is, for example, a color filter substrate, and located at the viewing side of the substrate 40. A color filter, a black matrix (BM), an opposed electrode, an alignment layer, and the like are formed on the opposed substrate. Incidentally, the opposed electrode may be located on the substrate 40 rather than on the opposed substrate. A liquid crystal layer is sandwiched between the substrate 40 and the opposed substrate. That is, liquid crystal is filled between the substrate 40 and the opposed substrate. Furthermore, a polarizing plate, a retardation film, and the like are provided on the outer surfaces of the substrate 40 and the opposed substrate. Furthermore, a backlight unit or the like is provided at the non-viewing side of the liquid crystal display panel.

The liquid crystal is driven by the electric field between the pixel electrode and the opposed electrode. That is, it changes the alignment direction of the liquid crystal located between the substrates. With this change, the polarization state of light passing through the liquid crystal layer changes. That is, light which passes through the polarization plate becomes linearly polarized light, and it further changes its polarization state by passing through the liquid crystal layer. Specifically, light from the backlight unit becomes linearly polarized light by the polarizing plate located on the array substrate side. As the linearly polarized light passes through the liquid crystal layer, its polarization state changes.

The amount of the light that passes through the polarizing plate located on the opposed substrate side varies depending on the polarization state. That is, the amount of the light that passes through the polarizing plate at the viewing side, out of the transmitted light that is transmitted from the backlight unit to the liquid crystal display panel, varies. The alignment direction of the liquid crystal varies depending on the applied display voltage. Therefore, the amount of the light that passes through the polarizing plate at the viewing side can be varied by controlling the display voltage. That is, a desired image can be displayed by varying the display voltages on a pixel-by-pixel basis. The above explanation has summarized the display device. A semiconductor device for use in such display devices and a method of manufacturing the semiconductor device, as well as various aspects of them are explained hereinafter.

First Embodiment

Figure 2:
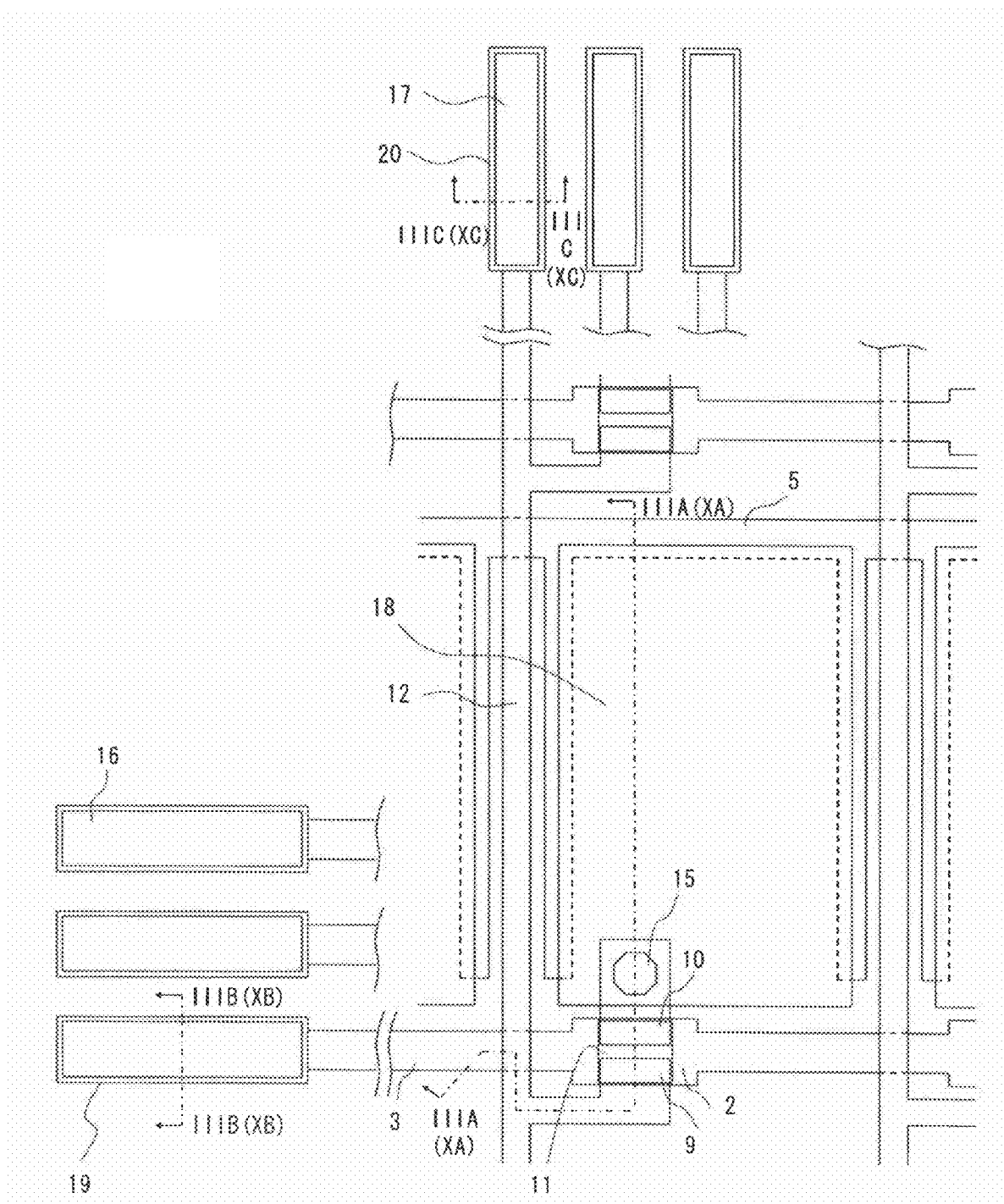
FIG. 2 is a plane view showing an active matrix type TFT array substrate for use in a display apparatus in accordance with first and third embodiments of the present invention.
Figure 3:
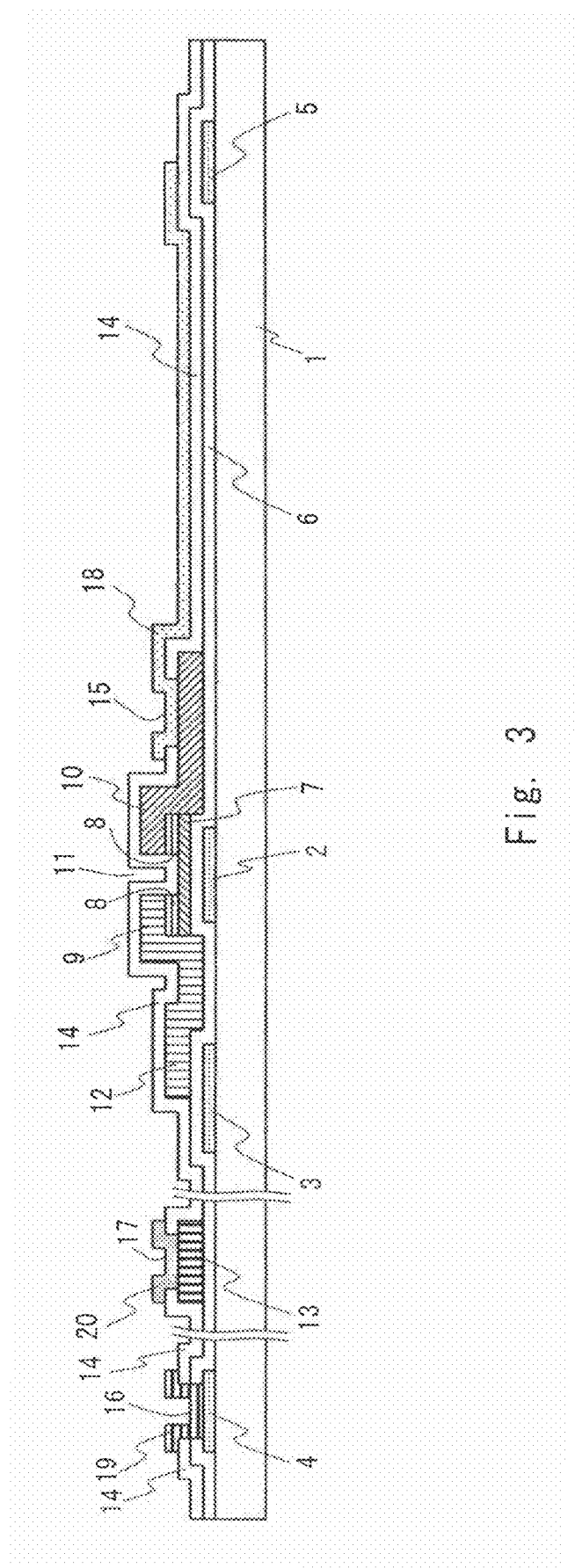
FIG. 3 is a cross sectional view showing an active matrix TFT array substrate for use in a display apparatus in accordance with the first embodiment of the present invention.

As a first embodiment in accordance with the present invention, an example of an active matrix type TFT array substrate for use in a liquid crystal display device, which uses liquid crystals as display elements, is explained in detail hereinafter. FIG. 2 shows an example of the planar geometry of the substrate, and FIG. 3 shows the cross-sectional structures of the substrate as taken along the line IIIA-IIIA and other lines in FIG. 2. IIIA-IIIA section, IIIB-IIIB section, and IIIC-IIIC section indicated by the dashed lines in FIG. 2 are shown in the cross sectional views of FIG. 3 in order to facilitate the explanation of the manufacturing process of the TFT array substrate. In particular, IIIB-IIIB section (left side portion) including a gate terminal portion 4 and IIIC-IIIC section (middle portion) including a source terminal portion 13, as well as IIIA-IIIA section (right side portion) including a TFT and a pixel portion are shown in FIG. 3. The other cross-sectional figures that are used for the later explanations also show multiple sections in the same manner.

In FIG. 2 or FIG. 3, the insulating substrate 1 is composed of glass, plastic, or the like. At least a gate electrode 2, a gate line 3 connected to the gate electrode 2, a gate terminal portion 4 connected to the gate line 3 for receiving video scanning signals, and an auxiliary capacitance electrode 5, all of which are composed of a metal film, are formed on the insulating substrate 1. Furthermore, a gate insulating film 6 is formed in the upper layer of these components. Furthermore, a semiconductor film 7 becomes a component of the TFT that is formed in the vicinity of the gate electrode 2 disposed in the lower layer of the semiconductor film 7 with the gate insulating film 6 interposed therebetween. An ohmic low-resistance Si film 8 is a semiconductor film of Si to which impurities are added. The source electrode 9 and the drain electrode 10 are composed of an Al alloy film, and each of them is directly connected to the ohmic low-resistance Si film 8.

A channel portion 11 of the TFT is formed in the area where the source electrode 9 and the drain electrode 10 are separated from each other and the ohmic low resistance Si film 8 is removed. A source line 12 is a line that is connected to the source electrode 9. FIG. 3 does not clearly illustrate the boundary between the source electrode 9 and the source line 12. A source terminal portion 13 is connected to the source line 12, and an external video signal is inputted through the source terminal portion 13. An interlayer insulating film 14 is formed so as to cover the entire substrate including the channel portion 11.

A plurality of openings (three openings in FIG. 3) are formed in the interlayer insulating film 14. A pixel drain contact hole 15 is one of the openings that extends to the drain electrode 10 in the lower layer. A gate terminal portion contact hole 16 is one of the openings that extends to the gate terminal portion 4. A source terminal portion contact hole 17 is one of the openings that extends to the source terminal portion 13. Furthermore, a transparent pixel electrode 18 is a transparent conducting film that is connected to the drain electrode 10 through the pixel drain contact hole 15. A gate terminal pad 19 is a pad that is connected to the gate terminal portion 4 through the gate terminal portion contact hole 16. A source terminal pad 20 is a pad that is connected to the source terminal portion 13 through the source terminal portion contact hole 17.

The semiconductor device, i.e., an optical display device used for a display apparatus is manufactured by attaching an active matrix type TFT array substrate constructed in the above-mentioned manner and an opposed substrate (not shown), which is equipped with color filters for color display, opposed electrodes, and the like, with a specific gap (cell gap) provided therebetween, and then filling the gap with liquid crystal and sealing the liquid crystal.

Next, a manufacturing process of an active matrix type TFT array substrate in accordance with the first embodiment of the present invention is explained with reference to FIGS. 4A to 4C, and 5A to 5B. Firstly, an insulating substrate 1 composed of a glass substrate or the like is cleaned with cleaning liquid or pure water, and a metal film is formed on the insulating substrate 1 as shown FIG. 4A. After the film formation, the metal film is patterned into a desired shape by a first photolithography process in order to form a gate electrode 2, a gate line 3, a gate terminal portion 4, and an auxiliary capacitance electrode 5. The metal film is preferably formed by using metal or alloy having low specific electrical resistance.

As a preferable embodiment, firstly, an AlNi alloy film containing Ni by 2 mol % (at %) is formed to 200 nm thickness by a well-known sputtering process using argon (Ar) gas or krypton (Kr) gas. A DC (direct current) magnetron sputtering method was used for the sputtering process, and the film was formed by using an AlNi alloy target composed of Al containing Ni by 2 mol % under the condition of film-formation power-density of 3 W/cm$^2$ and Ar gas flow rate of 2.4× $10^{-3}$ m$^3$/h (40 sccm). Next, a photoresist pattern was formed by a photolithography process, and then the AlNi film was etched by using a publicly-known chemical solution containing components of phosphoric acid series, nitric acid series, and acetic acid series. The patterns of the gate electrode 2, gate line 3, gate terminal portion 4, and auxiliary capacitance electrode 5 were formed by removing the photoresist pattern. At this point, the Ni composition of the formed AlNi alloy film was 2 mol % Ni, which was substantially the same as the composition of the target. Furthermore, although the specific resistance was about 12 μΩ·cm immediately after the film formation, it was lowered to about 5 μΩ·cm after subjected to a processing temperature in the order of about 300° C. as explained later. This value is lower than that of typical high melting point metal of the related art, and therefore enabling to lower the resistance of the gate line 3.

Subsequently, a gate insulating film 6 composed of silicon nitride (SiN), a Si semiconductor active film 7 composed of amorphous silicon (a-Si), and an ohmic low-resistance Si film 8 composed of n-type amorphous silicon added with impurities (n+a-Si) are successively formed as shown in FIG. 4B. After the film formation, the Si semiconductor active film 7 and the ohmic low-resistance Si film 8 are patterned into desired shapes by a second photolithography process such that they have appropriate shapes as the components of the TFT.

As a preferable embodiment, a chemical vapor deposition (CVD) process was used, and 400 nm of SiN film, 150 nm of a-Si film, and 50 nm of n+a-Si film to which phosphorus (P) was added as impurities were successively formed as the gate insulating film 6, the Si semiconductor active film 7, and the ohmic low-resistance Si film 8 respectively under the substrate heating condition of about 300° C. Next, after a photoresist pattern was formed by a photolithography process, the a-Si film and the n+a-Si film were etched by a dry-etching process using publicly-known fluorine-based gas. Then, the semiconductor patterns (Si semiconductor active film 7 and ohmic low-resistance Si film 8), which became components of the TFT, were formed by removing the photoresist pattern.

Subsequently, an Al alloy film is formed, and then the Al alloy film is patterned into a desired shape by a third photolithography process in order to form a source electrode 9, a drain electrode 10, a source line 12, a source terminal portion 13, and a channel portion 11 of the TFT as shown in FIG. 4C. The Al alloy film used in this process is preferably formed by using an alloy film having such advantages that it has a low specific electrical resistance, it shows a good contact characteristic with the ohmic low-resistance Si film 8, and it has a good contact characteristic (especially low electrical contact resistance) with a conducting film used for a transparent pixel electrode (which is indicated by the sign 18 in the later explanations) and the like.

As a preferable embodiment, the Al alloy film was formed by a DC magnetron sputtering process using an AlNi alloy target composed of Al containing Ni by 2 mol %. The sputtering was carried out with such a condition that about 200 nm of AlNiN film was formed using mixed gas generated by adding $N_2$ gas having flow rate of $3\times10^{-4}$ $m^3$/h (5 sccm) in Ar gas having flow rate of $2.4\times10^{-3}$ $m^3$/h (40 sccm) with film-formation power-density of 3 W/cm². Next, a photoresist pattern was formed by a photolithography process, and then the AlNiN film was etched by using a publicly-known chemical solution containing components of phosphoric acid series, nitric acid series, and acetic acid series in order to form the patterns of the source electrode 9, the drain electrode 10, the source line 12, and the source terminal portion 13. Next, the ohmic low-resistance Si film 8 between the source electrode 9 and the drain electrode 10 was etched by a publicly-known dry-etching process using fluorine-based gas, and then the channel portion 11 of the TFT was formed by removing the photoresist pattern.

The examination of the composition of that AlNiN film showed that the film was an alloy film containing Ni by 2 mol % and N by 5 mol %. Furthermore, although the specific resistance was about 15 $\mu\Omega\cdot$cm immediately after the film formation, it was lowered to about 10 $\mu\Omega\cdot$cm after subjected to heat treatment of about 300° C. This value is lower than that of typical high melting point metal of the related art, and therefore enabling to lower the resistance of the source line 12. Incidentally, although the mixture of Ar gas and $N_2$ gas was used as the sputtering gas in the above-described embodiment, Kr gas may be used as a substitute for the Ar gas. In such a case, the number of defects and the stress of the film can be reduced compared to those in the case where Ar gas is used. Therefore, the specific resistance can be reduced to about 10 $\mu\Omega\cdot$cm even without carrying out the heat treatment. Furthermore, the gas that is added during the sputtering in order to add N in the Al film does not limited to $N_2$ gas. Instead, any gas that contain N, such as $NH_3$, can be used to add N in the Al film. Alternatively, it can be formed by using AlNiN alloy to which N is added in advance as the sputtering target. In such a case, it does not necessarily require the use of the mixed gas that is generated by adding $N_2$ or gas containing N to Ar gas or Kr gas. Instead, Ar gas or Kr gas with no additive can be used for the film formation.

Subsequently, an interlayer insulating film 14 is formed as a passivation film, and then the interlayer insulating film is patterned into a desired shape by a fourth photolithography process in order to form at least a pixel drain contact hole 15 that extends to the surface of the drain electrode 10, a gate terminal portion contact hole 16 that extends to the surface of the gate terminal portion 4, and a source terminal portion contact hole 17 that extends to the surface of the source terminal portion 13 simultaneously as shown in FIG. 5A.

As a preferable embodiment, 300 nm of silicon nitride SiN film is formed as the interlayer insulating film 14 by using a chemical vapor deposition (CVD) process under the substrate heating condition of about 300° C. Then, a photoresist pattern is formed by a photolithography process. Then, the film was etched by a dry-etching process using publicly-known fluorine-based gas, and the pixel drain contact hole 15, the gate terminal portion contact hole 16, and the source terminal portion contact hole 17 were formed by removing the photoresist pattern.

Finally, a transparent conducting film is formed, and then the transparent conducting film is patterned into a desired shape by a fifth photolithography process in order to form the pattern of a transparent pixel electrode 18 that is electrically connected to the drain electrode 10 in the lower layer through the pixel drain contact hole 15, and the patterns of a gate terminal pad 19 and a source terminal pad 20 that are electrically connected to the gate terminal portion 4 and the source terminal portion 13 through the gate terminal portion contact hole 16 and the source terminal portion contact hole 17 respectively as shown in FIG. 5B. In this manner, an active matrix TFT array substrate that can be suitably used for a liquid crystal display device in accordance with the first embodiment of the present invention is manufactured. Incidentally, the completed TFT array substrate may be subjected to heat treatment at a temperature of about 200 to 300° C. In this manner, static charges and stresses accumulated throughout the entire substrate are removed or alleviated. In addition, it is also preferable because the electrical specific resistance of the metal film can be lowered, and thereby enabling to improve and stabilize the TFT characteristics.

As a preferable embodiment, an ITO film composed of the compound of indium oxide ($In_2O_3$) with tin oxide ($SnO_2$) is formed to 100 nm thickness as the transparent conducting film by a sputtering process using publicly-known Ar gas. After the film formation, a photoresist pattern was formed by using a photolithography process, and the film was etched by using a publicly-known solution containing hydrochloric acid and nitric acid. Then, the transparent pixel electrode 18, and the gate terminal pad 19 and the source terminal pad 20 were formed by removing the photoresist pattern. Subsequently, the substrate was subjected to heat treatment in which the substrate was held in the atmosphere of about 300° C. for 30 minutes.

A TFT array substrate manufactured in this manner has such a structure that the film containing Si as the main ingredient is directly connected to the source electrode 9 and the drain electrode 10 that are composed of the Al alloy film. Specifically, it was formed such that the ohmic low-resistance Si film 8 containing Si as the main ingredient was directly connected to the Al alloy film of the source electrode 9 and the drain electrode 10 without interposing any barrier layer composed of high melting point metal therebetween. In the specification of the present application, the term "film containing Si as the main ingredient" means a Si film or a film containing Si as the main ingredient, i.e., a film containing Si as the ingredient having the highest content ratio. Furthermore, the term "in the vicinity of the interface or in the vicinity of the bonding interface" means, though depending on various conditions such as film thickness, the region that is closer to the boundary surface at least than the center in the film thickness direction is. Furthermore, the connection between a film containing Si as the main ingredient and an Al alloy film includes the state where at least a portion of the film containing Si as the main ingredient is connected to at least a portion of the Al alloy film.

A TFT array substrate in accordance with this embodiment exhibited as good TFT characteristics as those of TFT array substrates having high melting point metal formed as barrier layers in the related art, though the TFT array substrate of this embodiment was not provided with such high melting point metal barrier layer. This is because the occurrence of diffusion reactions is prevented by the additions of Ni and N to the Al alloy film. Furthermore, even in the case where the heat-treatment temperature was increased to 350° C., no diffusion reaction was observed in the bonding interface and the TFT characteristics were not deteriorated. Therefore, it has confirmed that a TFT array substrate in accordance with this embodiment has sufficient heat resistance. Furthermore, since the source lines 12 as well as gate lines 3 can be formed from a low-resistance Al alloy film alone, high display quality display apparatuses can be manufactured with low cost and high productivity without suffering from display unevenness or faulty display caused by signal delays or the likes resulting from the increase in the resistance of wirings even in the productions of large display devices or compact high-resolution display devices.

Second Embodiment

Figure 6:
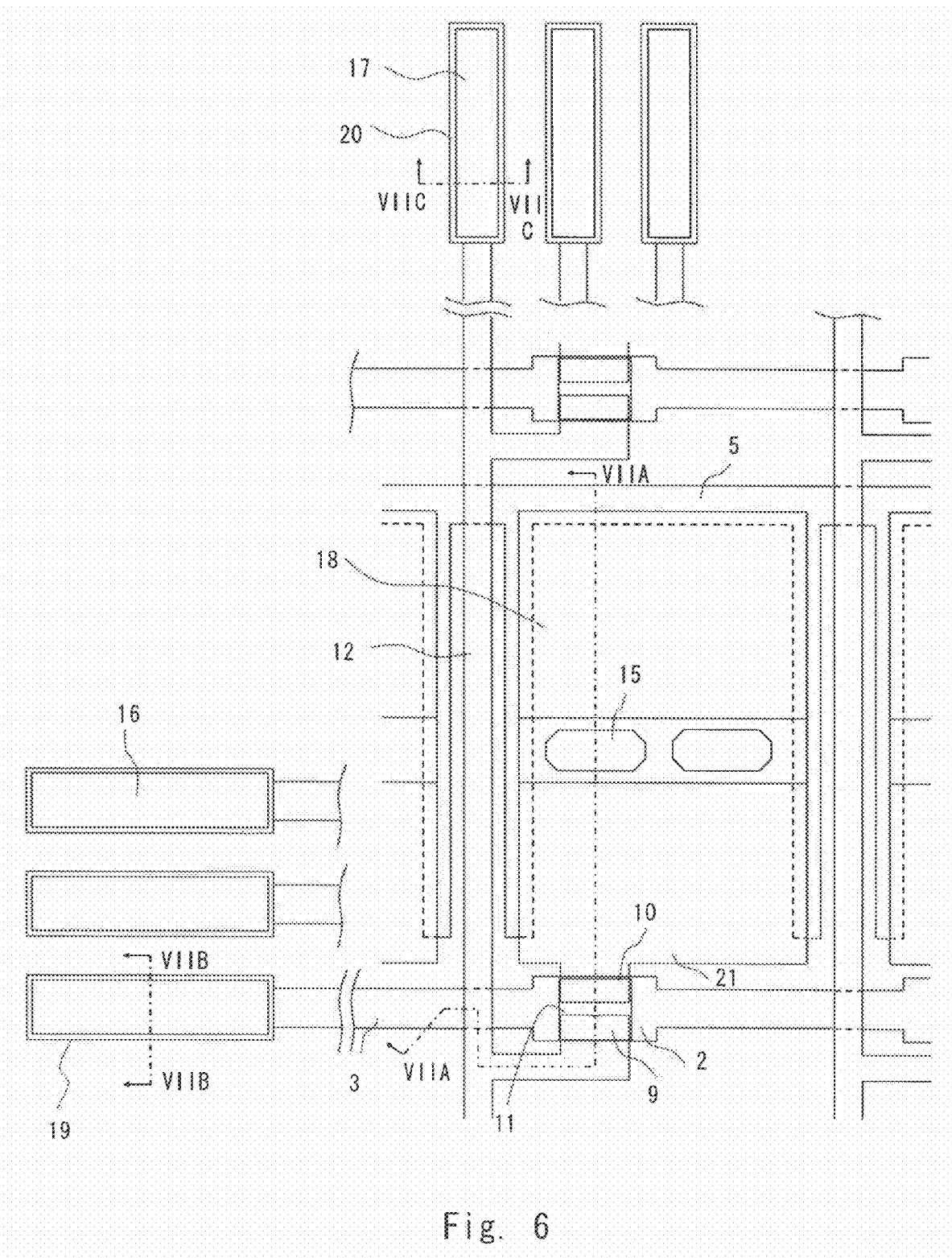
FIG. 6 is a plane view showing an active matrix type TFT array substrate for use in a display apparatus in accordance with a second embodiment of the present invention.
Figure 7:
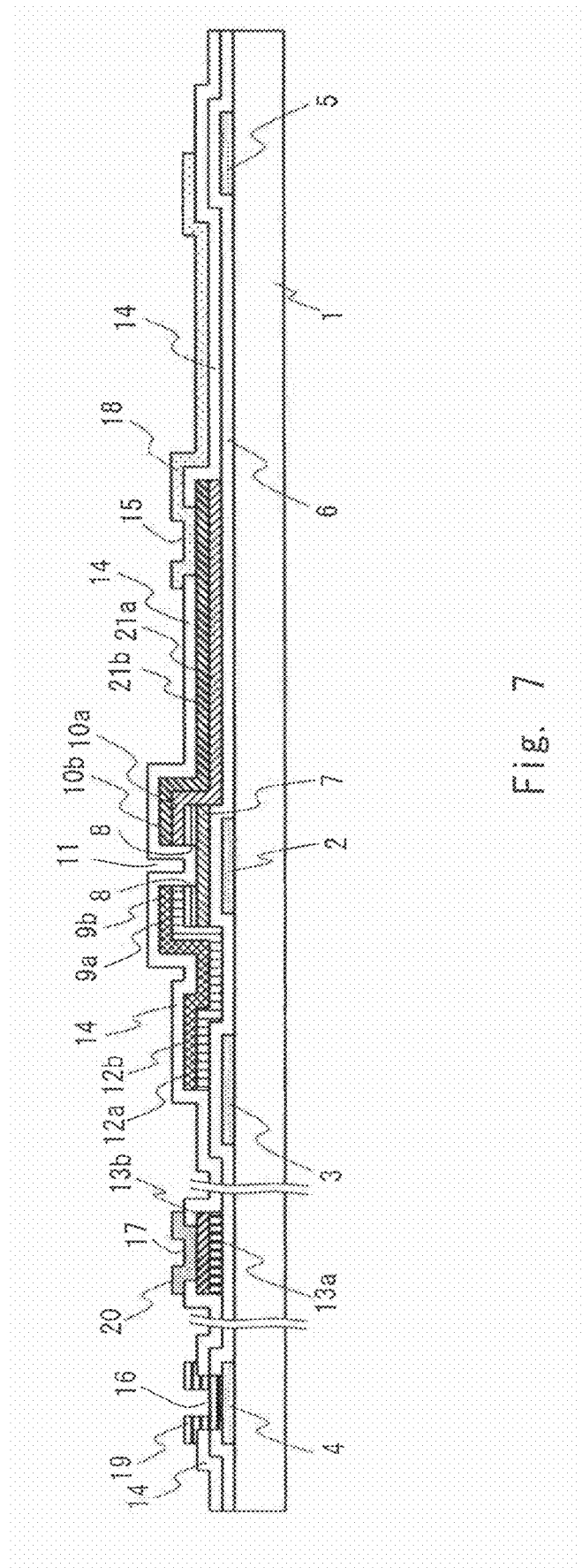
FIG. 7 is a cross sectional view showing an active matrix TFT array substrate for use in a display apparatus in accordance with the second embodiment of the present invention.

As a second embodiment of the present invention, a different example of an active matrix type TFT array substrate for use in a liquid crystal display device, which uses liquid crystals as display elements, from the first embodiment is explained hereinafter. FIG. 6 shows the planar geometry of the substrate, and FIG. 7 shows the cross-sectional structures of the substrate as taken along the line VIIA-VIIA and other lines in FIG. 6. VIIA-VIIA section, VIIB-VIIB section, and VIIC-VIIC section indicated by the dashed lines in FIG. 6 are shown in the cross sectional views of FIG. 7. The substrate in accordance with the second embodiment is different from the first embodiment in that the substrate of this embodiment is used for a transflective display device or a partially-reflective display device in which a part of the drain electrode also serve as reflective pixel electrode that reflect light to display images, while the substrate of the first embodiment is used for a fully-transmissive display device in which the entire light is transmitted to display images. Therefore, source electrodes and drain electrodes are required to have high surface reflectance characteristics in addition to the ability to prevent the interfacial diffusion reactions with the Si film.

In FIGS. 6 and 7, the components that have the same signs as those in FIGS. 2 and 3 are the same as or similar to those of FIGS. 2 and 3, and therefore explanations of them are omitted as appropriate. Each of the source electrode 9 and the drain electrode 10 is composed of an Al alloy film, and is directly connected to the ohmic low-resistance Si film 8. The channel portion 11 of the TFT is formed in the area where the source electrode 9 and the drain electrode 10 are separated from each other and the ohmic low resistance Si film 8 is removed. The source line 12 is a line that is connected to the source electrode 9. The source terminal portion 13 is connected to the source line 12, and receives external video signals. FIG. 7 does not clearly illustrate the boundary between the source electrode 9 and the source line 12. Furthermore, a reflective pixel electrode 21 is an electrode that is formed by extending the drain electrode 10. Higher surface reflectivity of the reflective pixel electrode 21 can give brighter and higher-quality display characteristics. Therefore, the Al alloy film constituting these electrodes is formed from at least two-layer films, i.e., an Al alloy film having a good contact characteristic with the ohmic low-resistance Si film located in the under layer (first aluminum alloy film) and another Al alloy film having high reflectivity that is formed in the upper layer (second aluminum alloy film). Specifically, the first aluminum alloy film includes lines and electrodes indicated by the signs 9a, 10a, 12a, 13a, and 21a, and the second aluminum alloy film includes lines and electrodes indicated by the signs 9b, 10b, 12b, 13b, and 21b.

A plurality of openings (three openings in FIG. 7) are formed in the interlayer insulating film 14. A pixel drain contact hole 15 is one of the openings that extends to the reflective pixel electrode 21 that also serves as the drain electrode 10 in the lower layer. A gate terminal portion contact hole 16 is one of the openings that extends to the gate terminal portion 4. A source terminal portion contact hole 17 is one of the openings that extends to the source terminal portion 13. Furthermore, a transparent pixel electrode 18 is composed of a transparent conducting film that is connected to the reflective pixel electrode 21 through the pixel drain contact hole 15. A gate terminal pad 18 is a pad that is connected to the gate terminal portion 4 through the gate terminal portion contact hole 16, and a source terminal pad 20 is a pad that is connected to the source terminal portion 13 through the source terminal portion contact hole 17.

The semiconductor device, i.e., an optical display device used for a display apparatus is manufactured by attaching an active matrix type TFT array substrate constructed in the above-mentioned manner and an opposed substrate (not shown), which is equipped with color filters for color display, opposed electrodes, and the like, with a specific gap (cell gap) provided therebetween, and then filling the gap with liquid crystal and sealing the liquid crystal.

Next, a manufacturing process of an active matrix type TFT array substrate in accordance with the second embodiment of the present invention is explained with reference to FIGS. 8A to 8C, and 9A to 9B. Firstly, an insulating substrate 1 composed of a glass substrate or the like is cleaned with cleaning liquid or pure water, and a metal film is formed on the insulating substrate 1 as shown FIG. 8A. After the film formation, the metal film is patterned into a desired shape by a first photolithography process in order to form a gate electrode 2, a gate line 3, a gate terminal portion 4, and an auxiliary capacitance electrode 5. The metal film is preferably formed by using metal or alloy having low specific electrical resistance.

As a preferable embodiment, firstly, an AlNi alloy film containing Ni by 1 mol % is formed to 200 nm by a well-known sputtering process using Ar gas or Kr gas. A DC magnetron sputtering mode was used for the sputtering process, and the film was formed by using an AlNi alloy target composed of Al containing Ni by 1 mol % under the condition of film-formation power-density of 3 W/cm$^2$ and Ar gas flow rate of $2.4 \times 10^{-3}$ m$^3$/h (40 sccm). Next, a photoresist pattern was formed by a photolithography process, and then the AlNi film was etched by using a publicly-known chemical solution containing components of phosphoric acid series, nitric acid series, and acetic acid series. The patterns of the gate electrode 2, gate line 3, gate terminal portion 4, and auxiliary capacitance electrode 5 were formed by removing the photoresist pattern. At this point, the Ni composition of the formed AlNi alloy film was 1 mol % Ni, which was substantially the same as the composition of the target. Furthermore, although the specific resistance was about 8 μΩ·cm immediately after the film formation, it could be lowered to about 4 μΩ·cm by carrying out heat treatment in the order of about 300° C. This value is lower than that of typical high melting point metal of the related art, and it has the effect of lowering the resistance of the gate line 3.

Figure 8A:
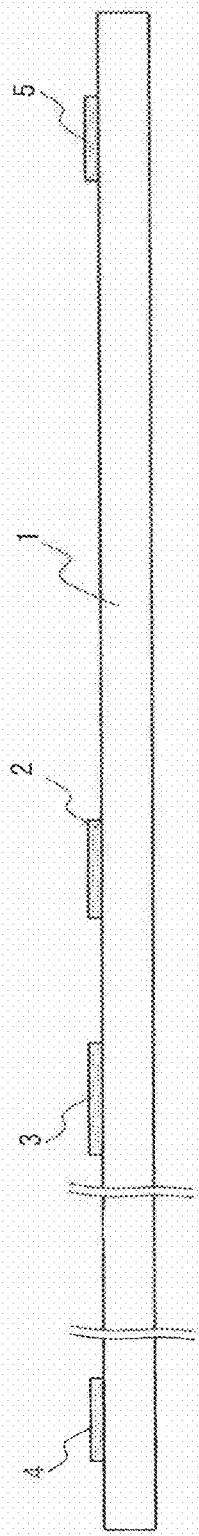
FIGS. 8A, 8B, and 8C are cross sectional views showing processes of the manufacturing process of an active matrix TFT array substrate for use in a display apparatus in accordance with the second embodiment of the present invention.
Figure 8B:
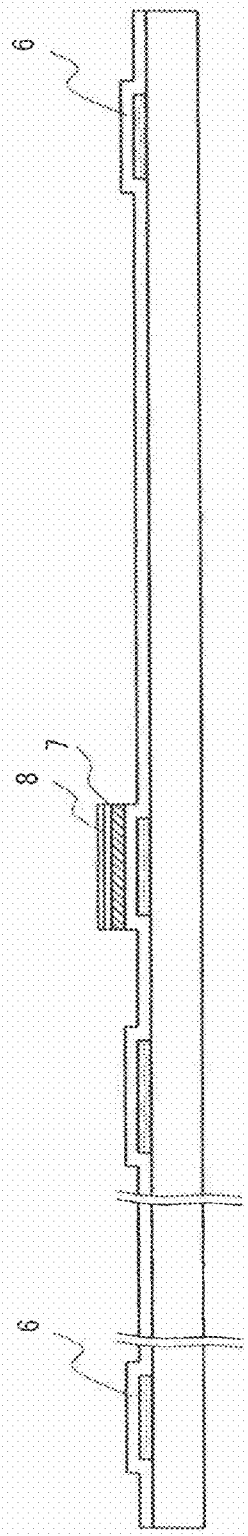

Next, a gate insulating film 6 composed of silicon nitride (SiN), a Si semiconductor active film 7 composed of amorphous silicon (a-Si), and an ohmic low-resistance Si film 8 composed of n-type amorphous silicon added with impurities (n+a-Si) are successively formed as shown in FIG. 8B. After the film formation, the Si semiconductor active film 7 and the ohmic low-resistance Si film 8 are patterned into desired shapes by a second photolithography process such that they have appropriate shapes as the components of the TFT.

As a preferable embodiment, a chemical vapor deposition (CVD) process was used, and 400 nm of SiN film, 150 nm of a-Si film, and 50 nm of n+a-Si film to which phosphorus (P) was added as impurities were successively formed as the gate insulating film 6, the Si semiconductor active film 7, and the ohmic low-resistance Si film 8 respectively under the substrate heating condition of about 300° C. Next, after a photoresist pattern was formed by a photolithography process, the a-Si film and the n+a-Si film were etched by a dry-etching process using publicly-known fluorine-based gas. Then, the semiconductor patterns (Si semiconductor active film 7 and ohmic low-resistance Si film 8), which became components of the TFT, were formed by removing the photoresist pattern.

Figure 8C:
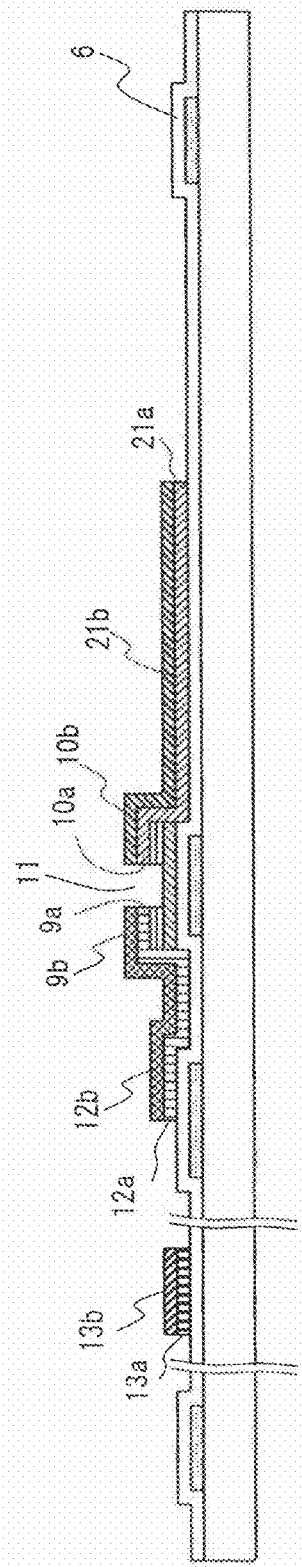

Next, an Al alloy film is formed, and then the Al alloy film is patterned into a desired shape by a third photolithography process in order to form a source electrode 9, a drain electrode 10, a source line 12, a source terminal portion 13, and a channel portion 11 of the TFT as shown in FIG. 8C. The Al alloy film used in this process is preferably formed by using an alloy film having such advantages that it has a low specific electrical resistance, it shows a good contact characteristic with the ohmic low-resistance Si film 8, it has a good contact characteristic (especially low electrical contact resistance) with a conducting film used for a transparent pixel electrode (which is indicated by the sign 18 in the later explanations), and it has high light reflectivity and the like.

As a preferable embodiment, the Al alloy film was formed by a DC magnetron sputtering process using an AlNi alloy target composed of Al containing Ni by 1 mol %. The sputtering was carried out with such a condition that about 50 nm thickness of AlNiN film was formed using mixed gas generated by adding $N_2$ gas having flow rate of $1.2 \times 10^{-3}$ $m^3/h$ (20 sccm) in Ar gas having flow rate of $2.4 \times 10^{-3}$ $m^3/h$ (40 sccm) with film-formation power-density of 3 $W/cm^2$. Next, the addition of $N_2$ gas was stopped (flow rate of 0 $m^3/h$), and about 200 nm thickness of AlNi film to which N was not added was formed using Ar gas alone with film-formation power-density of 3 $W/cm^2$. Next, a photoresist pattern was formed by a photolithography process, and then the two-layer films of AlNi upper layer/AlNiN lower layer were collectively etched by using a publicly-known chemical solution containing components of phosphoric acid series, nitric acid series, and acetic acid series in order to form the patterns of the source electrode 9b/9a, the drain electrode 10b/10a, the source line 12b/12a, the source terminal portion 13b/13a, and the reflective pixel electrode 21b/21a. Next, the ohmic low-resistance Si film 8 between the source electrode 9 and the drain electrode 10 was etched by a publicly-known dry-etching process using fluorine-based gas, and then the photoresist pattern was removed to form the channel portion 11 of the TFT.

The examination of the composition of that AlNiN lower layer film showed that the lower layer film was an alloy film containing Ni by 1 mol % and N by 20 mol %. Furthermore, the specific resistance was about 55 $\mu\Omega\cdot cm$ immediately after the film formation, and then it became about 50 $\mu\Omega\cdot cm$ after subjected to heat treatment of about 300° C. This value is equivalent to or larger than that of typical high melting point metal in the related art, and therefore it seems to have no effect of lowering the resistance. However, since the AlNi upper layer film has Ni composition of 1 mol % and its specific resistance is about 8 $\mu\Omega\cdot cm$ immediately after the film formation and about 4 $\mu\Omega\cdot cm$ after subjected to heat treatment of about 300° C., it is possible to lower the resistance of the source lines 12, in comparison to the case where high melting point metal of the related art is used, by adopting the two-layer films. Furthermore, although the light reflectivity of the AlNiN lower layer film measured at a wavelength of 550 nm was 70%, the light reflectivity of the AlNi upper layer film was 93%, which was as high as that of pure Al. As described above, when the Al alloy film is formed from stacked-layer films of at least two or more layers, multiple Al alloy films, each of which is optimized for different kind of characteristic, can be combined so that both the function to prevent the interfacial diffusion reactions with a Si film or a film containing Si as the main ingredient and the function to achieve the low specific resistance and the high reflectivity are separately accomplished. Such structures are preferable because they can exhibit desired performances for devices in a more effective manner.

Incidentally, the mixture of Ar gas and $N_2$ gas was firstly used as the sputtering gas to form the AlNiN lower layer, and then the AlNi upper layer film was formed using Ar gas alone as the sputtering gas in the above-described embodiment. However, after the process is started with the formation of the AlNiN lower layer film using the mixture of Ar gas and $N_2$ gas, the additive amount of the $N_2$ gas may be, for example, reduced gradually with the passage of sputtering time. In such a case, since the Al alloy film can be continuously formed without interrupting the sputtering process, the processing time can be reduced. Furthermore, although the mixture of Ar gas and $N_2$ gas was used as the sputtering gas in the embodiment, Kr gas may be used as a substitute for the Ar gas. Since the diffusion reactions can be also prevented by the presence of Ni and N in the vicinity of the interface with the ohmic low-resistance Si film in the lower layer in the Al alloy film formed in this manner, the specific resistance throughout the entire film can be reduced and the high reflectivity comparable to that of pure Al film can be achieved.

Figure 9A:
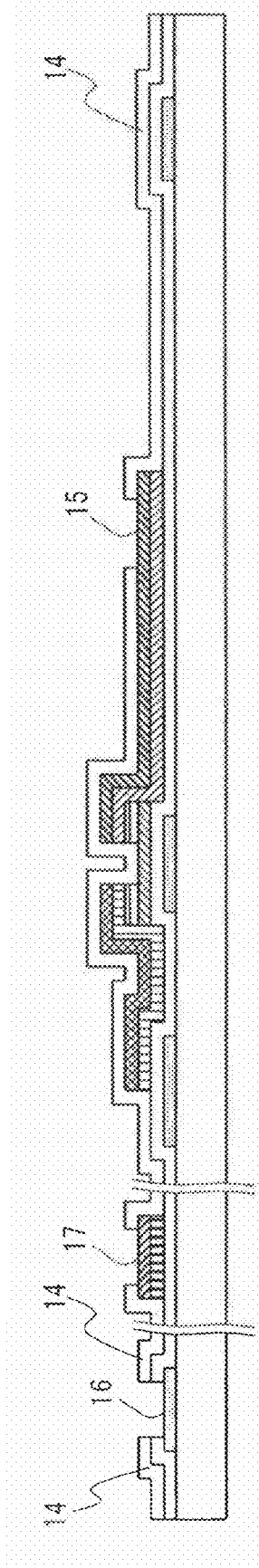
FIGS. 9A and 9B are cross sectional views showing processes of the manufacturing process of the active matrix TFT array substrate for use in a display apparatus in accordance with the second embodiment of the present invention.

Next, an interlayer insulating film 14 is formed as a passivation film, and then the interlayer insulating film is patterned into a desired shape by a fourth photolithography process in order to form at least a pixel drain contact hole 15 that extends to the surface of the drain electrode 10b (reflective pixel electrode 21b), a gate terminal portion contact hole 16 that extends to the surface of the gate terminal portion 4, and a source terminal portion contact hole 17 that extends to the surface of the source terminal portion 13b simultaneously as shown in FIG. 9A.

As a preferable embodiment, 300 nm of silicon nitride SiN film is formed as the interlayer insulating film 14 by using a chemical vapor deposition (CVD) process under the substrate heating condition of about 300° C. Then, a photoresist pattern is formed by a photolithography process. Then, the film was etched by a dry-etching process using publicly-known fluorine-based gas, and the photoresist pattern was removed to form the pixel drain contact hole 15, the gate terminal portion contact hole 16, and the source terminal portion contact hole 17.

Figure 9B:
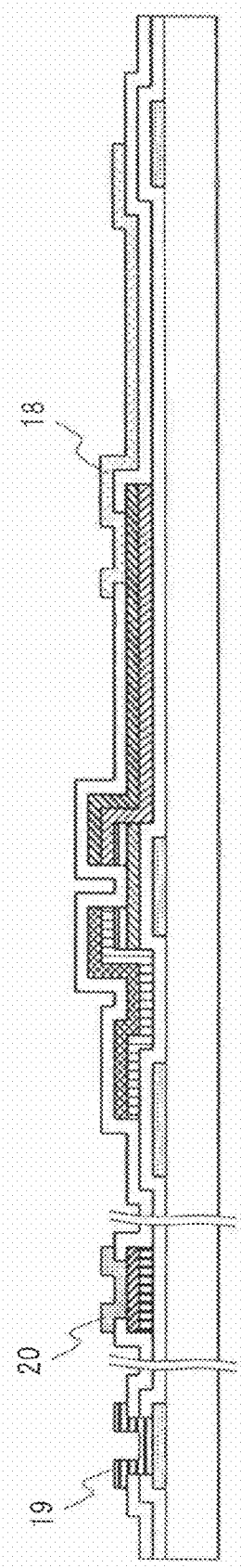

Finally, a transparent conducting film is formed, and then the transparent conducting film is patterned into a desired shape by a fifth photolithography process in order to form the pattern of a transparent pixel electrode 18 that is electrically connected to the drain electrode 10b (reflective pixel electrodes 21b) in the lower layer through the pixel drain contact hole 15, and the patterns of a gate terminal pad 19 and a source terminal pad 20 that are electrically connected to the gate terminal portion 4 and the source terminal portion 13 through the gate terminal portion contact hole 16 and the source terminal portion contact hole 17 respectively as shown in FIG. 9B. In this manner, an active matrix TFT array substrate that can be suitably used for a liquid crystal display device in accordance with the second embodiment of the present invention is manufactured. Incidentally, the completed TFT array substrate may be subjected to heat treatment at a temperature of about 200 to 300° C. In this manner, static charges and stresses accumulated throughout the entire substrate are removed or alleviated. In addition, it is also preferable because the electrical specific resistance of the metal film can be lowered, and thereby enabling to improve and stabilize the TFT characteristics.

As a preferable embodiment, an ITO film composed of the compound of indium oxide ($In_2O_3$) with tin oxide ($SnO_2$) is formed to 100 nm thickness as the transparent conducting film by a sputtering process using publicly-known Ar gas. After the film formation, a photoresist pattern was formed by using a photolithography process, and the film was etched by using a publicly-known solution containing hydrochloric acid and nitric acid. Then, the transparent pixel electrode 18, and the gate terminal pad 19 and the source terminal pad 20 were formed by removing the photoresist pattern. Subsequently, the substrate was subjected to heat treatment in which the substrate was held in the atmosphere of about 300° C. for 30 minutes.

A TFT array substrate manufactured in such manner has such a structure that the ohmic low-resistance Si film 8 containing Si as the main ingredient was directly connected to the source electrode 9 and the drain electrode 10 composed of an Al alloy film without interposing a barrier layer composed of high melting point metal therebetween. Although the Al alloy film is directly connected to the ohmic low-resistance Si film 8 without any barrier layer interposed therebetween, the occurrence of the diffusion reactions in the bonding interface is prevented and it has exhibited as good TFT characteristics as those in the related art case where high melting point metal is used, because of the additions of Ni and N in the vicinity of the bonding interface of the Al alloy film. Furthermore, even in the case where the heat-treatment temperature was increased to 350° C., no diffusion reaction was observed in the bonding interface and the TFT characteristics were not deteriorated, confirming that it has sufficient heat resistance. Furthermore, since an AlNi film to which N is not added is formed on the surface opposite to the bonding surface, high reflectivity is achieved in the reflective electrode portion, and therefore it can provide bright, high-quality transflective display devices. Furthermore, since the source lines 12 as well as gate lines 3 can be formed from a low-resistance Al alloy film alone, large display devices or compact high-resolution display devices having excellent display quality can be manufactured with low cost and high productivity without suffering from display unevenness or faulty display caused by signal delays or the likes resulting from the increase in the resistance of wirings.

Third Embodiment

Figure 10:
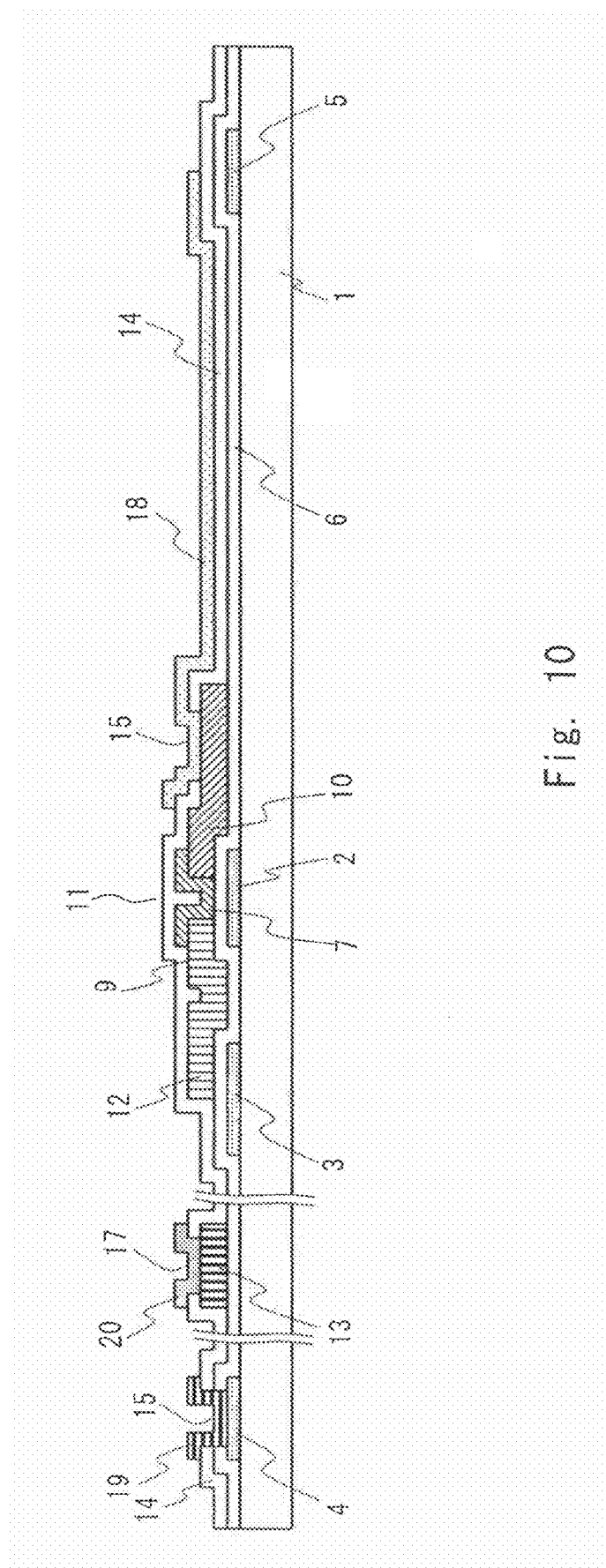
FIG. 10 is a cross sectional view showing an active matrix TFT array substrate for use in a display apparatus in accordance with the third embodiment of the present invention.
Figure 11A:
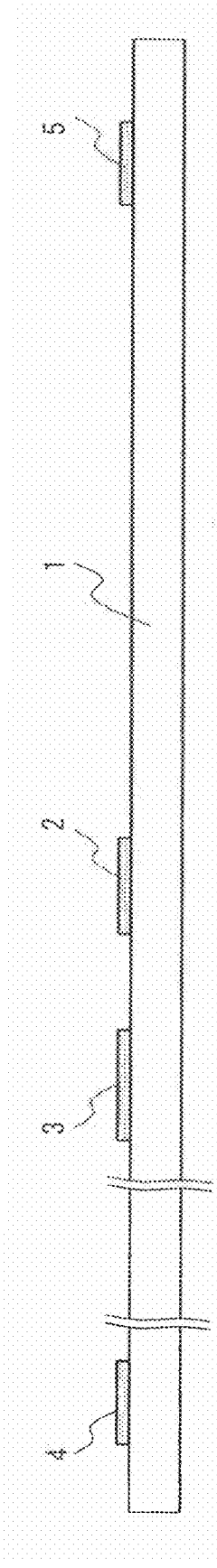
FIGS. 11A, 11B, and 11C are cross sectional views showing processes of the manufacturing process of an active matrix TFT array substrate for use in a display apparatus in accordance with the third embodiment of the present invention.
Figure 11B:
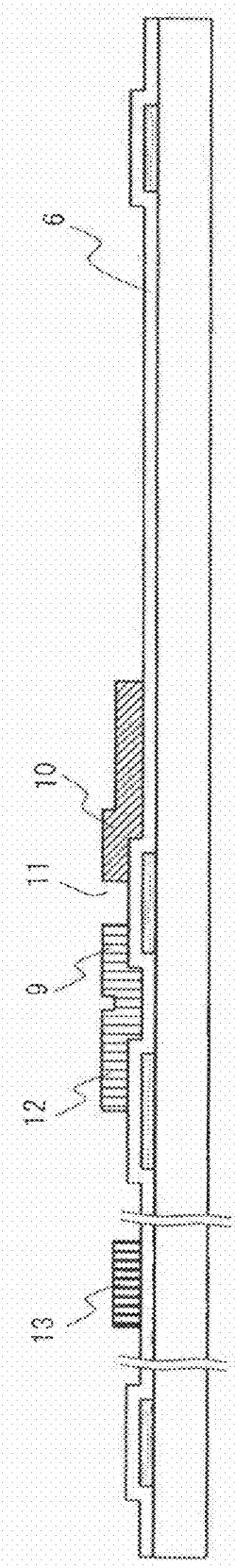
Figure 11C:
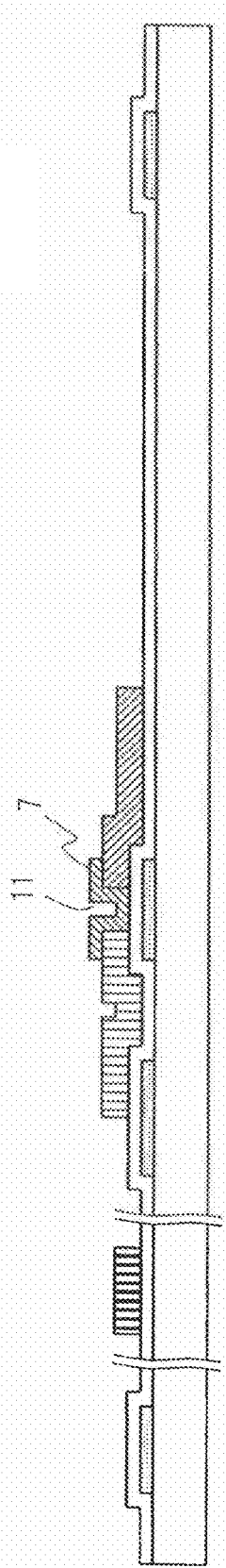

As a third embodiment of the present invention, a different example of an active matrix type TFT array substrate for use in a liquid crystal display device, which uses liquid crystals as display elements, from the first and second embodiments is explained hereinafter. FIG. 2 shows the planar geometry of the substrate, and FIG. 10 shows the cross-sectional structures of the substrate as taken along the line XA-XA and other lines in FIG. 2. XA-XA section, XB-XB section, and XC-XC section indicated by the dashed lines in FIG. 2 are shown in the cross sectional views of FIG. 10. In FIG. 10, the components that have the same signs as those in FIGS. 2 and 3 are the same as or similar to those of FIGS. 2 and 3, and therefore explanations of them are omitted as appropriate.

This embodiment is different from the first embodiment only in the structure of TFTs. Other structures are the same as or similar to those of the first embodiment, and therefore explanations of them are omitted as appropriate. As shown in FIG. 10, the Si semiconductor active film 7 is provided above the source electrode 9 and the drain electrode 10 in an active matrix type TFT array substrate in accordance with this embodiment. Specifically, the Si semiconductor active film 7, which has roughly the same size as the gate electrode 2, is formed above the source electrode 9 and the drain electrode 10. The Si semiconductor active film 7 is formed as one continuous pattern extending from an area on the source electrode 9 to an area on the drain electrode 10. Furthermore, the portion of the Si semiconductor active film 7 that is sandwiched between the source electrode 9 and the drain electrode 10 constitutes the TFT channel portion 11. Therefore, the Si semiconductor active film 7 and the ohmic low-resistance Si film 8 are not provided between the gate insulating film 6 and the source electrode 9 and the drain electrode 10 in this embodiment.

Next, a manufacturing method of an active matrix type TFT array substrate in accordance with the third embodiment of the present invention is explained with reference to FIGS. 11A to 11C, and 12A to 12B. Firstly, an insulating substrate 1 composed of a glass substrate or the like is cleaned with cleaning liquid or pure water, and a metal film is formed on the insulating substrate 1 as shown FIG. 11A. After the film formation, the metal film is patterned into a desired shape by a first photolithography process in order to form a gate electrode 2, a gate line 3, a gate terminal portion 4, and an auxiliary capacitance electrode 5. The metal film is preferably formed by using metal or alloy having low specific electrical resistance.

As a preferable embodiment, firstly, an AlNi alloy film containing Ni by 2 mol % is formed to 200 nm thickness by a publicly-known sputtering process using Ar gas or Kr gas. A DC magnetron sputtering mode was used for the sputtering process, and the film was formed by using an AlNi alloy target composed of Al containing Ni by 2 mol % under the condition of film-formation power-density of 3 W/cm$^2$ and Ar gas flow rate of $2.4 \times 10^{-3}$ m$^3$/h (40 sccm). Next, a photoresist pattern was formed by a photolithography process, and then the AlNi film was etched by using a publicly-known chemical solution containing components of phosphoric acid series, nitric acid series, and acetic acid series. Then, the patterns of the gate electrode 2, gate line 3, gate terminal portion 4, and auxiliary capacitance electrode 5 were formed by removing the photoresist pattern. At this point, the Ni composition of the formed AlNi alloy film was 2 mol % Ni, which was substantially the same as the composition of the target. Furthermore, although the specific resistance was about 12 μΩ·cm immediately after the film formation, it could be lowered to about 5 μΩ·cm by carrying out heat treatment in the order of about 300° C. This value is lower than that of typical high melting point metal of the related art, and it has the effect of lowering the resistance of the gate line 3.

Next, a gate insulating film 6 composed of silicon nitride (SiN) is formed, and then an Al alloy film is successively formed as shown in FIG. 8B. The Al alloy film is patterned into a desired shape by a second photolithography process in order to form a source electrode 9, a drain electrode 10, a source line 12, a source terminal portion 13, and a channel portion 11 of the TFT. The Al alloy film used in this process is preferably formed by using an alloy film having such advantages that it has a low specific electrical resistance, it shows a good contact characteristic with the ohmic low-resistance Si film 8, and it has a good contact characteristic (especially low electrical contact resistance) with a conducting film used for a transparent pixel electrode (which is indicated by the sign 18 in the later explanations) and the like.

As a preferable embodiment, 400 nm thickness of a SiN film is formed as the gate insulating film 6 by using a chemical vapor deposition (CVD) process under the substrate heating condition of about 300° C. Next, an Al alloy film was formed by a DC magnetron sputtering process using an AlNi alloy target composed of Al containing Ni by 2 mol %. The sputtering was carried out with such a condition that about 200 nm thickness of AlNiN film was formed using mixed gas generated by adding N$_2$ gas having flow rate of $3 \times 10^{-4}$ m³/h (5 sccm) in Ar gas having flow rate of $2.4 \times 10^{-3}$ m³/h (40 sccm) with film-formation power-density of 3 W/cm². Next, a photoresist pattern was formed by a photolithography process. Then the AlNiN film was etched by using a publicly-known chemical solution containing components of phosphoric acid series, nitric acid series, and acetic acid series, and the photoresist pattern was removed in order to form the patterns of the source electrode 9, the drain electrode 10, the source line 12, the source terminal portion 13, and the channel portion 11 of the TFT.

The examination of the composition of this AlNiN film showed that the film was an alloy film containing Ni by 2 mol % and N by 5 mol %. Furthermore, although the specific resistance was about 12 μΩ·cm immediately after the film formation, it was lowered to about 5 μΩ·cm after subjected to heat treatment of about 300° C. This value is lower than that of typical high melting point metal of the related art, and therefore enabling to lower the resistance of the source lines 12. Incidentally, although the mixture of Ar gas and N gas was used as the sputtering gas in the above-described embodiment, Kr gas may be used as a substitute for the Ar gas. In such case, the number of defects and the stress of the film can be reduced compared to those in the case where Ar gas is used. Therefore, the specific resistance can be reduced to about 5 μΩ·cm even without carrying out the heat treatment. Furthermore, the gas that is added during the sputtering in order to add N in the Al film does not limited to $N_2$ gas. Instead, any gas that contain N, such as $NH_3$, can be used to add N in the Al film. Alternatively, it can be formed by using AlNiN alloy to which N is added in advance as the sputtering target. In such case, it does not necessarily require the use of the mixed gas generated by adding $N_2$ or gas containing N to Ar gas or Kr gas. Instead, Ar gas or Kr gas with no additive can be used to form the AlNiN film.

Next, a Si semiconductor active film 7 composed of amorphous silicon (a-Si) is formed, and then the Si semiconductor active film 7 is patterned into a desired shape by a third photolithography process such that it has appropriate shapes as the components of the TFT.

As a preferable embodiment, 200 nm thickness of a-Si film is formed as the Si semiconductor active film 7 by using a chemical vapor deposition (CVD) process. Next, after a photoresist pattern was formed by a photolithography process, the a-Si film was etched by a dry-etching process using publicly-known fluorine-based gas. Then, the photoresist pattern was removed to form the semiconductor pattern (Si semiconductor active film 7), which became components of the TFT.

Figures 12A, 12B:
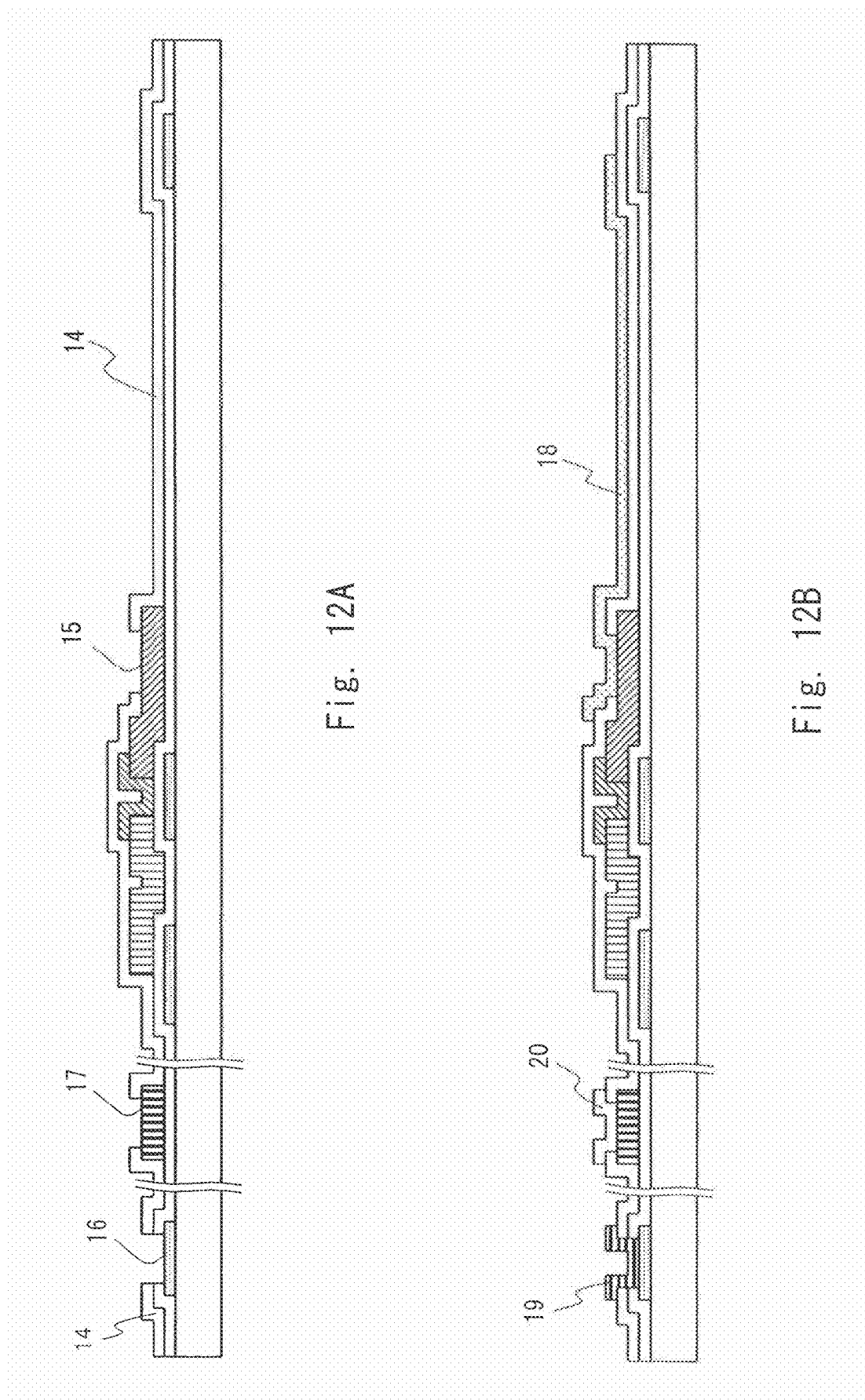
FIGS. 12A and 12B are cross sectional views showing processes of the manufacturing process of the active matrix TFT array substrate for use in a display apparatus in accordance with the third embodiment of the present invention.

Next, an interlayer insulating film 14 is formed as a passivation film, and then the interlayer insulating film is patterned into a desired shape by a fourth photolithography process in order to form at least a pixel drain contact hole 15 that extends to the surface of the drain electrode 10, a gate terminal portion contact hole 16 that extends to the surface of the gate terminal portion 4, and a source terminal portion contact hole 17 that extends to the surface of the source terminal portion 13 simultaneously as shown in FIG. 12A.

As a preferable embodiment, 300 nm of silicon nitride SiN film is formed as the interlayer insulating film 14 by using a chemical vapor deposition (CVD) process under the substrate heating condition of about 300° C. Then, a photoresist pattern is formed by a photolithography process. Then, the film was etched by a dry-etching process using publicly-known fluorine-based gas, and the pixel drain contact hole 15, the gate terminal portion contact hole 16, and the source terminal portion contact hole 17 were formed by removing the photoresist pattern.

Finally, a transparent conducting film is formed, and then the transparent conducting film is patterned into a desired shape by a fifth photolithography process in order to form the patterns of a transparent pixel electrode 18 that is electrically connected to the drain electrode 10 in the lower layer through the pixel drain contact hole 15, and the patterns of a gate terminal pad 19 and a source terminal pad 20 that are electrically connected to the gate terminal portion 4 and the source terminal portion 13 through the gate terminal portion contact hole 16 and the source terminal portion contact hole 17 respectively as shown in FIG. 12B. In this manner, an active matrix TFT array substrate that can be suitably used for a liquid crystal display device in accordance with the third embodiment of the present invention is manufactured. Incidentally, the completed TFT array substrate may be subjected to heat treatment at a temperature of about 200 to 300° C. In this manner, static charges and stresses accumulated throughout the entire substrate are removed or alleviated. In addition, it is also preferable because the electrical specific resistance of the metal film can be lowered, and thereby enabling to improve and stabilize the TFT characteristics.

As a preferable embodiment, an ITO film composed of the compound of indium oxide ($In_2O_3$) with tin oxide ($SnO_2$) is formed to 100 nm thickness as the transparent conducting film by a sputtering process using publicly-known Ar gas. After the film formation, a photoresist pattern was formed by using a photolithography process, and the film was etched by using a publicly-known solution containing hydrochloric acid and nitric acid. Then, the transparent pixel electrode 18, the gate terminal pad 19, and the source terminal pad 20 were formed by removing the photoresist pattern. Then, the substrate was subjected to heat treatment in which the substrate was held in the atmosphere of about 300° C. for 30 minutes.

A TFT array substrate manufactured in such manner has such a structure that the Si semiconductor active film 7 was directly connected to the source electrode 9 and the drain electrode 10 composed of Al alloy without interposing any barrier layer composed of high melting point metal therebetween. The occurrence of the diffusion reactions in the bonding interface is prevented and it has exhibited as good TFT characteristics as those in the related art case where high melting point metal is used, because of the additions of Ni and N in the vicinity of the bonding interface between the Al alloy film and the Si semiconductor active film 7. Furthermore, even in the case where the heat-treatment temperature was increased to 350° C., no diffusion reaction was observed in the bonding interface and the TFT characteristics were not deteriorated, confirming that it has sufficient heat resistance. Furthermore, since the source lines 12 as well as gate lines 3 can be formed from a low-resistance Al alloy film alone, high display quality display apparatuses can be manufactured with low cost and high productivity without suffering from display unevenness or faulty display caused by signal delays or the likes resulting from the increase in the resistance of wirings even in the productions of large display devices or compact high-resolution display devices.

Fourth Embodiment

Figure 13:
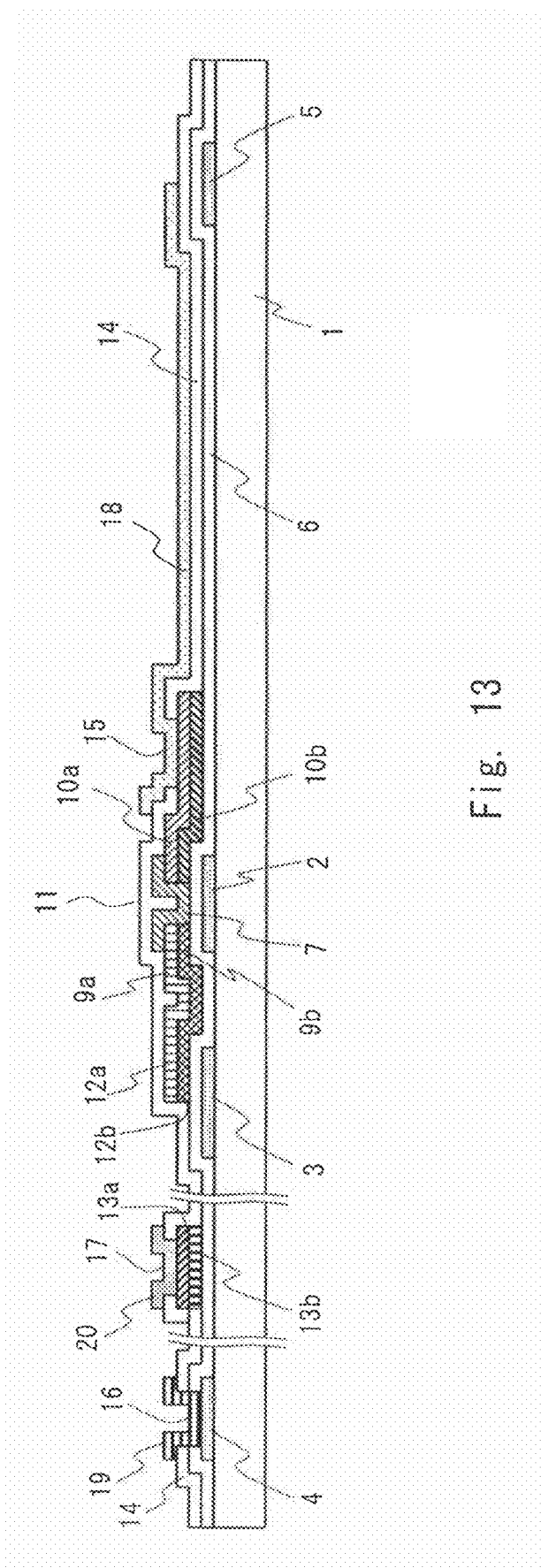
FIG. 13 is a cross sectional view showing an active matrix TFT array substrate for use in a display apparatus in accordance with a fourth embodiment of the present invention.

In the third embodiment, the source electrode 9 and the drain electrode 10 can be, for example, formed with a two-layer structure composed of an AlNiN upper layer film containing N and an AlNi lower layer film containing no N as shown in FIG. 13. This structure is preferable because it can lower the overall wiring resistance of the films.

As a preferable embodiment, a DC magnetron sputtering process using AlNi alloy targets composed of Al containing Ni by 1 mol % for forming the source electrode 9, the drain electrode 10, the source line 12, and the source terminal portion 13 was used. Specifically, about 200 nm thickness of AlNi film (second aluminum alloy film) was firstly formed by the DC magnetron sputtering process using an AlNi alloy target under the condition of Ar gas flow rate of $2.4 \times 10^{-3}$ m$^3$/h (40 sccm) and film-formation power-density of 3 W/cm$^2$. Next, about 50 nm thickness of AlNiN film (first aluminum alloy film) was formed using mixed gas generated by adding N$_2$ gas having flow rate of $1.2 \times 10^{-3}$ m$^3$/h (20 sccm) in Ar gas having flow rate of $2.4 \times 10^{-3}$ m$^3$/h (40 sccm) with film-formation power-density of 3 W/cm$^2$. Next, a photoresist pattern was formed by a photolithography process, and then the two-layer films of AlNiN upper layer/AlNi lower layer were collectively etched by using a publicly-known chemical solution containing components of phosphoric acid series, nitric acid series, and acetic acid series in order to form the patterns of the source electrode 9a/9b, the drain electrode 10a/10b, the source line 12a/12b, the source terminal portion 13a/13b, and the channel portion 11 of the TFT.

The examination of the composition of that AlNiN upper layer film showed that the upper layer film was an alloy film containing Ni by 1 mol % and N by 20 mol %. Furthermore, the specific resistance was about 55 μΩ·cm immediately after the film formation, and then it became about 50 μΩ·cm after subjected to heat treatment of about 300° C. This value is equivalent to or larger than that of typical high melting point metal in the related art, and therefore it seems to have no effect of lowering the resistance. However, since the AlNi lower layer film has Ni composition of 1 mol % and its specific resistance is about 8 μΩ·cm immediately after the film formation and about 4 μΩ·cm after subjected to heat treatment of about 300° C., it can further lower the resistance of the source line 12, in comparison to the above-described third embodiment, by adopting the two-layer films. As described above, when the Al alloy film is formed from stacked-layer films of at least two or more layers, multiple Al alloy films, each of which is optimized for different kind of characteristic, can be combined so that both the function to prevent the interfacial diffusion reactions with Si or a film containing Si as the main ingredient and the function to achieve the low specific resistance are separately accomplished. Such structures are preferable because they can exhibit desired performances for devices in a more effective manner.

Other structures and other steps of the manufacturing process and method in the fourth embodiment are the same as or similar to those of the third embodiment, and therefore explanations of them are omitted.

Other Embodiments

Although an ITO (indium oxide+tin oxide) film was used as the transparent conducting film to form the transparent pixel electrodes, terminal pads, and the likes in each of above-described embodiments, the material is not limited to the ITO. Instead, indium oxide (In$_2$O$_3$), tin oxide (SnO$_2$), zinc oxide (ZnO), and the combinations of these substances may be used as the material. For example, when an IZO film generated by combining indium oxide with zinc oxide is used, weak acid such as oxalic acid group can be used as the etching solution, instead of using strong acid such as (hydrochloric acid+nitric acid) group that was used in the above-described embodiments. Therefore, when an Al alloy film, which has poor resistance to acidic chemical solutions, is used as the metal film as in the cases of above-described embodiments, the use of such chemical solutions is preferable because it can prevent corrosion and breaking of wires such as electrodes and lines formed from the Al alloy film that would be otherwise caused by the infiltration of chemical solutions. Furthermore, when the oxygen composition of a sputtering film composed of indium oxide, tin oxide, or zinc oxide is smaller than its stoichiometry composition and thereby characteristics such as transmittance and specific resistance are unsatisfactory, it is preferable to use mixed gas generated by mixing O$_2$ or H$_2$O with Ar gas, rather than to use Ar gas containing no additive. Especially, when mixed gas generated by mixing H$_2$O with Ar gas is used as the sputtering gas, the film can be formed in the amorphous state rather than the normal polycrystalline state. Therefore, it enables the etching using a weak-acidic chemical solution of oxalic acid group. Such ITO films in the amorphous states are preferable in terms of reliability, because they can be changed into polycrystalline states, thereby into the normal ITO films having strong resistance to chemical solutions, by carrying out heat treatment at or above 200° C. after the etching process. Furthermore, although Al-1 mol % Ni-20 mol % N films and Al-2 mol % Ni-5 mol % N films were used as the Al alloy films that were directly connected to Si films or films containing Si as the main ingredients in the above-described embodiments, the Al alloy films are not limited to those films.

Figure 14A:
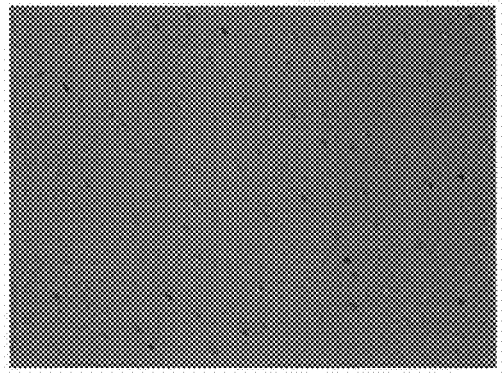
FIGS. 14A and 14B are photographs taken to examine the interfacial diffusion reactions between Al alloy films and Si films, showing an Al-2 mol % Ni film added with Ni by 2 mol % and an Al-2 mol % Cu film in FIG. 14A and FIG. 14B respectively.
Figure 14B:
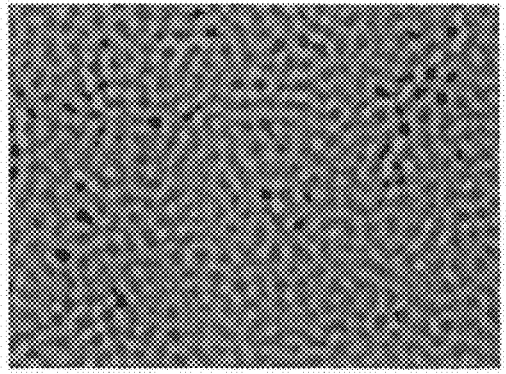

FIGS. 14A and 14B shows the results of interfacial diffusion reactions between Al alloy films and Si films evaluated by the inventor et al. of the present application. As the samples, 150 nm of a-Si film and 50 nm of ohmic low-resistance Si film added with P were successively formed by CDV processes, and the subsequent Al alloy film was formed to 200 nm thickness by a DC magnetron sputtering process. Then, after the heat treatment in which the samples were held in the atmosphere of 300° C. for 30 minutes, they were observed by an optical microscope. FIG. 14A shows the result of an Al-2 mol % Ni film in which Ni was added by 2 mol %, and FIG. 14B shows the result of an Al-2 mol % Cu film. The Al—Cu film is an example of publicly-known Al alloy films that are used to prevent the electro-migration and the stress-migration of Al films in the related art. As shown in FIG. 14B, maze-like irregularities were observed throughout the entire film in the case of the Al-2 mol % Cu film. A measurement was attempted to determine the specific resistance of this state of the film, but no electrical conductivity could be obtained. The film was substantially in the insulating state. Therefore, it can be speculated that interdiffusion reactions occur violently in the interface between Al and Si. Meanwhile, in the case of the Al-2 mol % Ni film, it exhibited the effect of suppressing the strong interdiffusion reactions occurring throughout the entire film, though some interdiffusion reactions occurred in spots. Furthermore, the specific electrical resistance was determined to be substantially equal to that in the case where the film is formed on a glass substrate in which no diffusion occurs. Similar suppressing effects were also observed in the cases where iron (Fe) and cobalt (Co), which belong to Group 8A (Groups 8 to 10) of the periodic table and have the 3d orbit as the outermost shell electron configuration as in the case of Ni, were used as substitutes for Ni.

Figure 15:
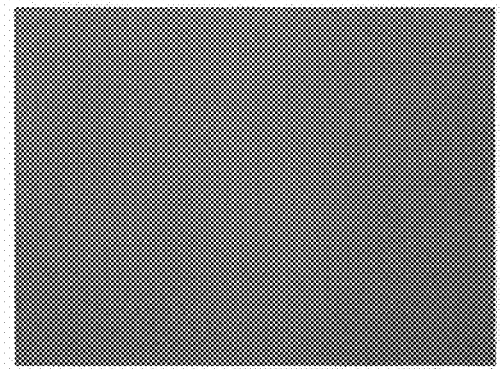
FIG. 15 is a picture (photograph) taken to examine the interfacial diffusion reaction between an Al—Ni—N film and a Si film.

FIG. 15 shows the result of similar evaluations carried out on Al-2 mol % Ni-4 mol % N films. It can be seen that interdiffusion reactions in spots observed in the sample shown FIG. 14A are not observed in this sample. This sample did not exhibit interdiffusion reactions even after the heat treatment in which the sample was held in the atmosphere of 400° C. for 30 minutes, confirming that it is also satisfactory in terms of heat resistance. Meanwhile, interdiffusion reactions were also not observed in Al-2 mol % Cu-4 mol % N films, exhibiting the effect of preventing interdiffusion reactions by the addition of N. However, diffusion reactions were observed after the heat treatment in which the sample was held in the atmosphere of 350° C. for 30 minutes.

Figure 16B:
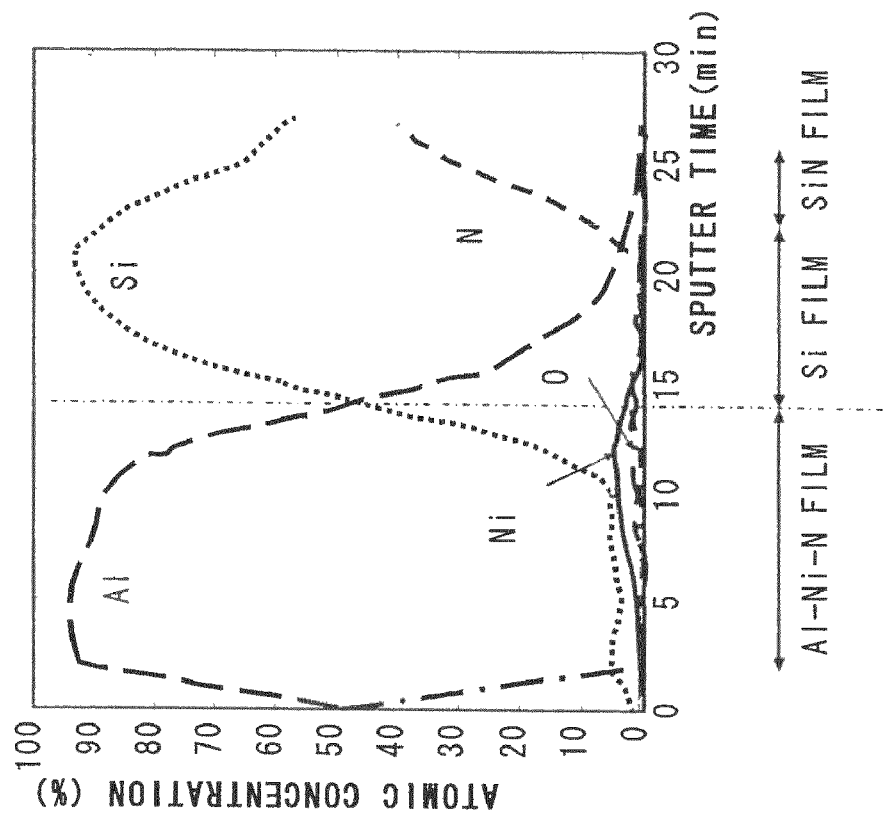
FIGS. 16A and 16B are graphs showing the element distribution in the vicinity of the interfaces between Al alloy films and Si films, showing the element distribution in the vicinity of the interface between an Al-2 mol % Ni-10 mol % N film and a Si film and the element distribution in the vicinity of the interface between an Al-2 mol % Ni film and a Si film in FIG. 16A and FIG. 16B respectively.
Figure 16A:
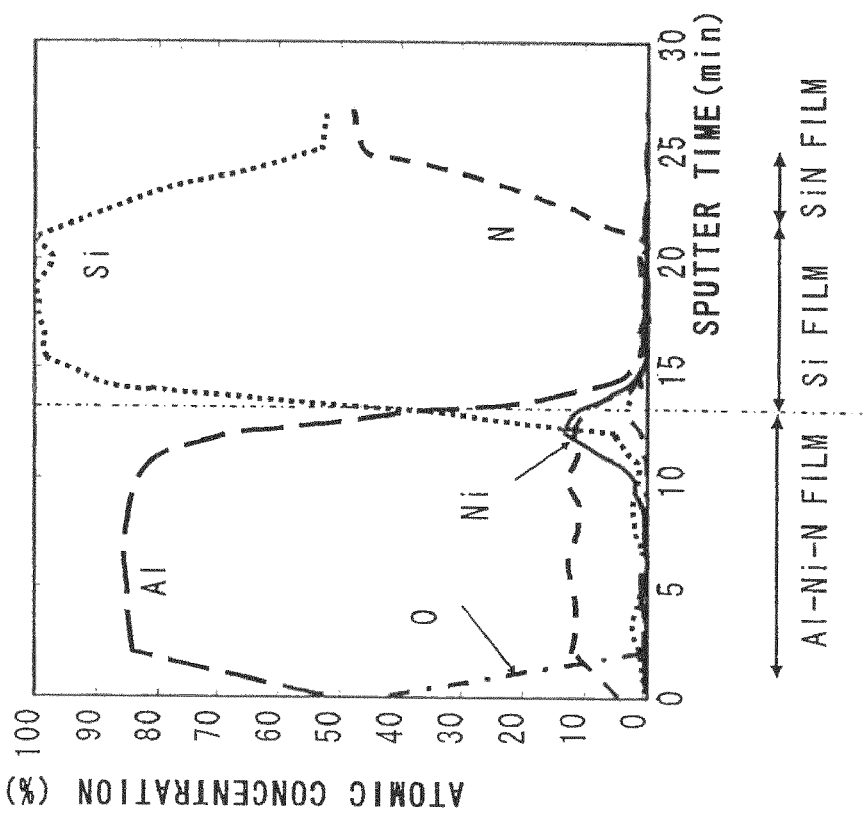

FIGS. 16A and 16B show element distributions in the vicinity of the interfaces between Al alloy films and Si films. In particular, FIG. 16A shows an element distribution state in the vicinity of the interface between an Al-2 mol % Ni-10 mol % N film and a Si film, and FIG. 16B shows an element distribution state in the vicinity of the interface between an Al-2 mol % Ni film and a Si film. FIGS. 16A and 16B show the results of the element distribution states examined by Auger electron spectroscopy (AES) analysis. Referring to FIG. 16B, the amount of Ni contained in the Al film is larger in the vicinity of the interface with the Si film. That is, it is speculated that Ni contained in the Al film moves to the vicinity of the interface and forms a barrier layer with the high concentration of Ni in the interface, and therefore suppresses the interfacial diffusions of Al and Si. Meanwhile, referring to FIG. 16A, it can be seen that the amount of Ni atoms in the vicinity of the interface with Si further increases in the case of the Al alloy film to which N is added, compared to the case shown in FIG. 16B where N is not added. Therefore, it can be seen that the interdiffusions of Al and Si atoms are also suppressed (the slopes of Al and Si distributions in the interface are steeper). That is, the addition of N atoms to an Al alloy film to which Ni (or, at least any one element of Fe and Co) atoms are already added improves the effect of concentrating the Ni atoms in the vicinity of the interface with Si. It is speculated that it acts as a barrier layer, and thereby firmly prevent the interdiffusions between the Al alloy film and the Si film.

Since the effects of such barrier layer are dependent on the apparatuses for forming Al alloy films, the process conditions of the film formation, and similar conditions, the film thickness of films to be formed and the compositions of Ni and N to be added may be determined as appropriate within the ranges with which manufactured devices satisfy the desired characteristic specifications. However, in order to exploit the effect of such barrier layers sufficiently, the film thickness is preferably equal to or larger than 5 nm, the Ni composition ratio is preferably equal to or higher than 0.1 mol %, and the N composition ratio is preferably equal to or higher than 1 mol %.

Figure 17:
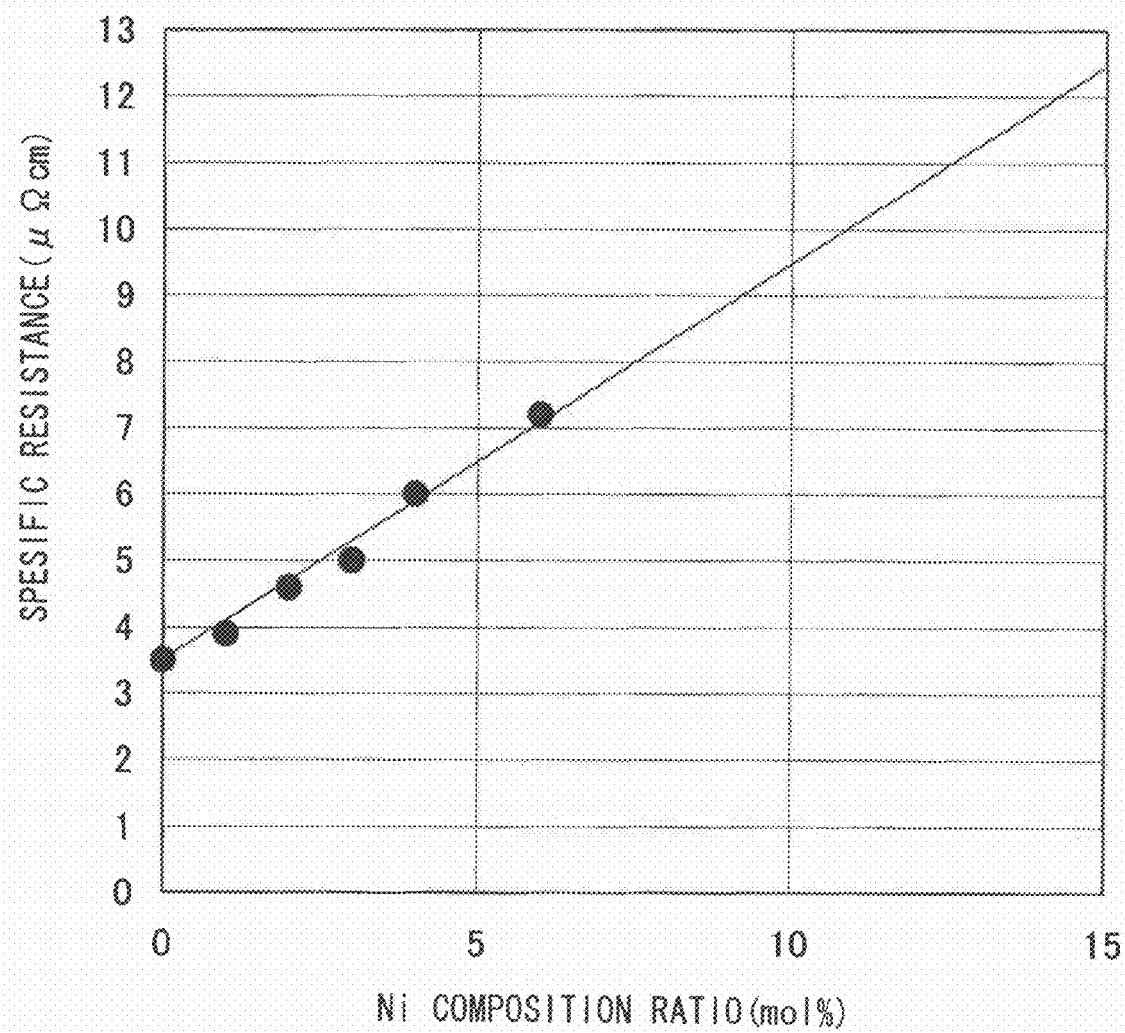
FIG. 17 is a graph showing the relation between the Ni composition ratio of an Al—Ni film and the specific resistance of the film.
Figure 18:
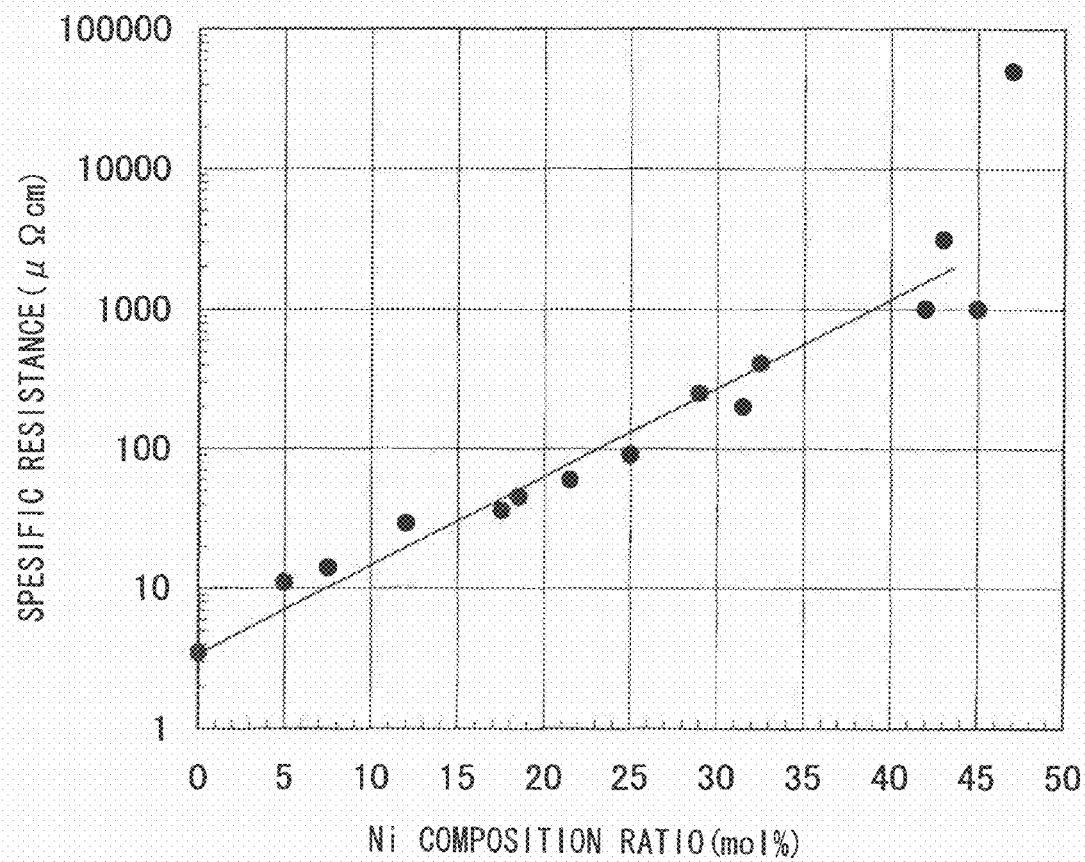
FIG. 18 is a graph showing the relation between the N composition ratio of an Al—N film and the specific resistance of the film.

FIG. 17 shows the variation in the specific resistance as different amounts of Ni are added to Al. As samples, Al alloy films were formed to about 200 nm thickness on glass substrates. Then, after the samples were subjected to heat treatments in which they were held in the atmosphere of 300° C. for 30 minutes, measurements were carried out. As can be seen from FIG. 17, Ni composition ratio larger than 15 mol % increases the specific resistance above 12 $\mu\Omega\cdot cm$, so that it loses the advantage over high melting point metal in the related art. Therefore, when it is applied to wiring films for which wiring resistance is important factor, the composition ratio of additive Ni should be preferably no more than 15 mol %. Furthermore, FIG. 18 shows the variation in the specific resistance as different amounts of N are added to Al. As can be seen from FIG. 18, the N composition ratio should be preferably no more than 7.5 mol % in order to prevent the increase in the specific resistance above 12 $\mu\Omega\cdot cm$.

Figure 19:
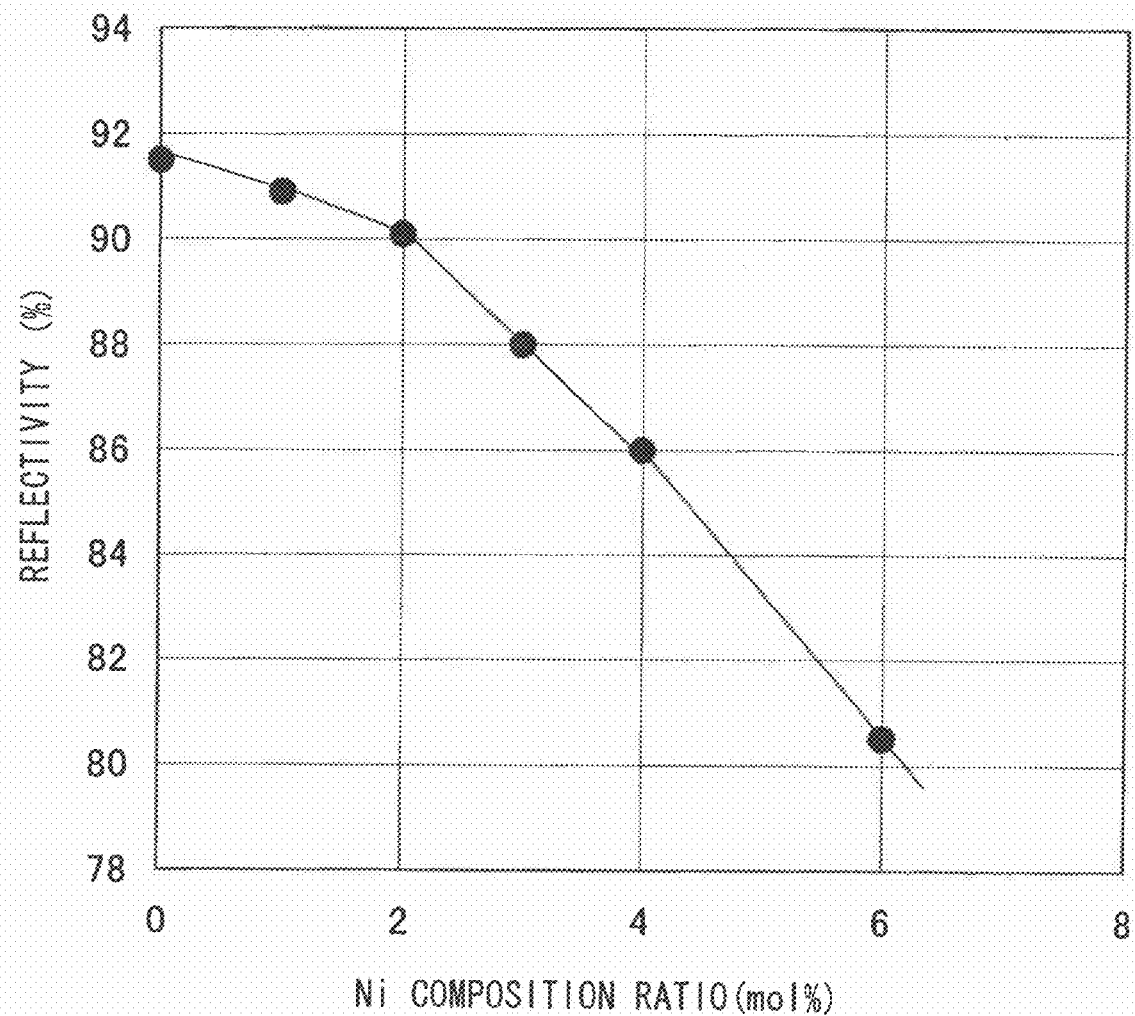
FIG. 19 is a graph showing the relation between the Ni composition ratio of an Al—Ni film and the reflectivity of the film.
Figure 20:
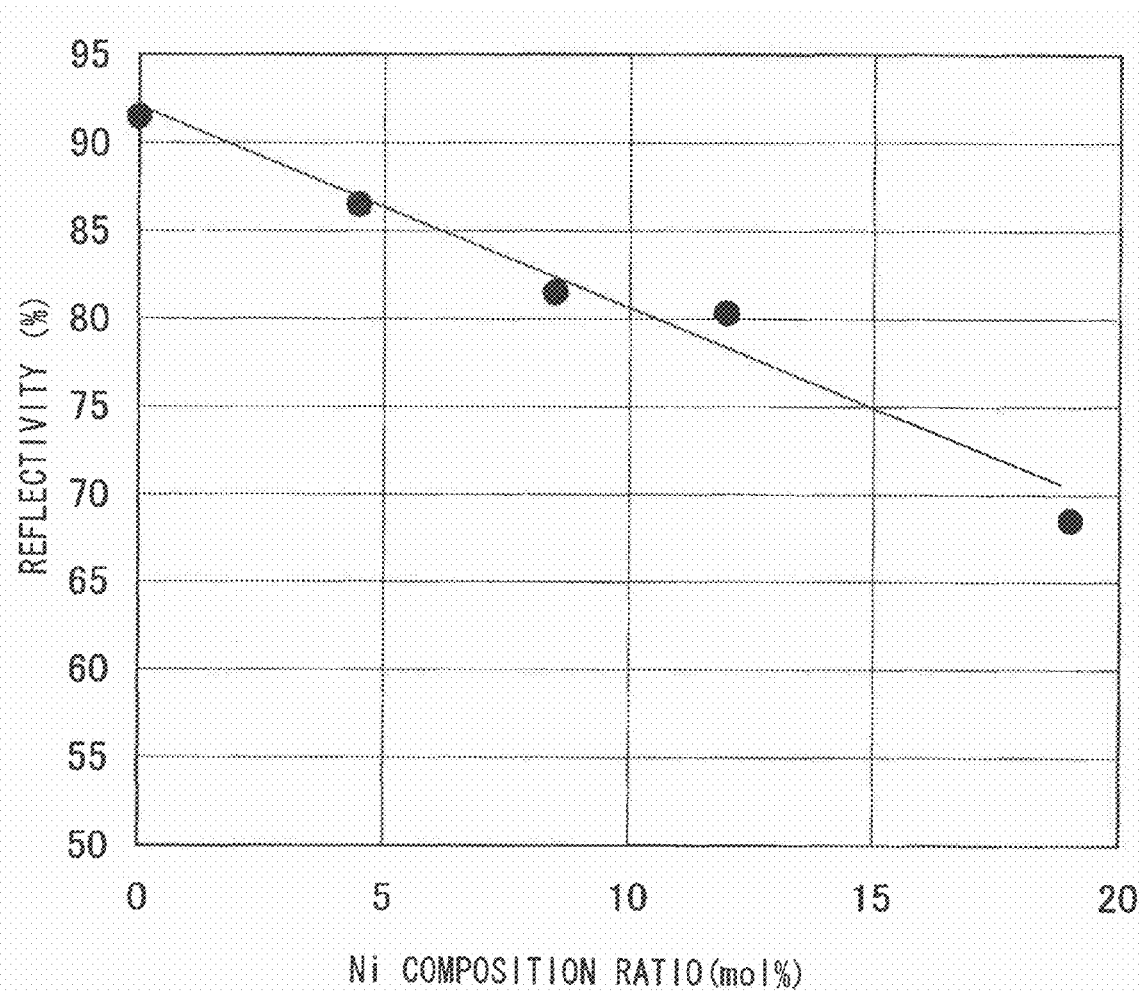
FIG. 20 is a graph showing the relation between the N composition ratio of an Al—N film and the reflectivity of the film.

FIGS. 19 and 20 show the variations in the reflectivity at a wavelength of 550 nm as different amounts of Ni and N respectively are added to Al. It can be seen that the reflectivity deceases steadily with the increase in the amounts of Ni and N respectively in both cases. Therefore, when it is applied to reflective plates for which the reflection characteristic is important factor, the composition ratio may be adjusted such that the desired characteristics are satisfied.

However, when the low specific resistance or the high reflectivity of the Al alloy films does not satisfy the desired specification for the devices because the suppression of the interfacial diffusion reactions with Si films or films containing Si as the main ingredients is regarded as more important, the compositions of the Al alloy films are not necessarily limited to above described ranges. Instead, the stacked-layer structure in which Al alloy films having different compositions are combined as explained with above-described second and fourth embodiments may be applied to such cases.

Figure 21A:
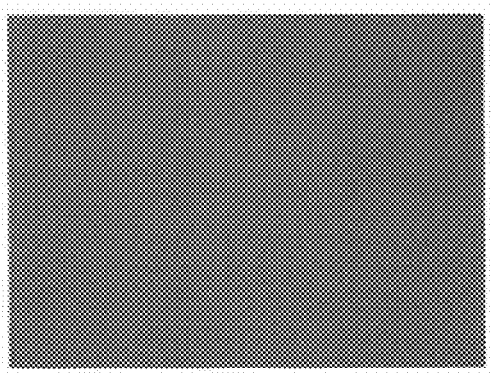
FIGS. 21A and 21B are photographs taken to examine the interfacial diffusion reactions between Al—Ni—Si films and Si films, showing an example with heat treatment of 300° C. and an example with heat treatment of 350° C.
Figure 21B:
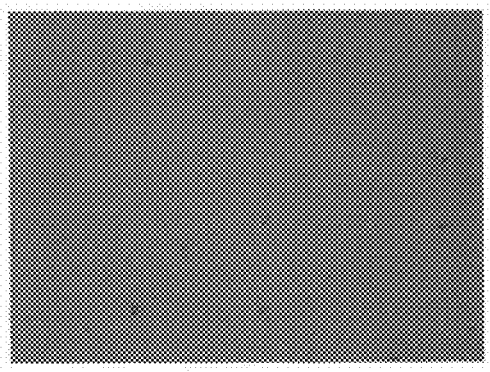

FIGS. 21A and 21B shows the evaluation results of the interfacial diffusions between Al-2 mol % Ni-1 mol % Si films and Si films. The Al-2 mol % Ni-1 mol % Si films werepreparedby adding silicon (Si), which belongs to Group 4B (Group 14) of the periodic table, by 1 mol % as a third additive element to the Al-2 mol % Ni base material shown in FIG. 14A. In particular, FIG. 21A shows the sample subjected to heat treatment of 300° C., and FIG. 21B shows the sample subjected to heat treatment of 350° C. It can be seen that interdiffusion reactions in spots are not observed in this sample, in contrast to the case of the Al-2 mol % Ni film. However, interdiffusion reactions were slightly observed in the case of the heat treatment of 350° C., confirming that the heat treatment is unsatisfactory. Similar suppressing effects were also observed in the cases where carbon (C), germanium (Ge), and tin (Sn), which are Group 4B semimetal elements as in the case of Si, were used as substitutes for Si. Therefore, it is preferable to add, in addition to Ni, at least one type of element selected from C, Si, Ge, and Sn, and to further add N to Al so that interdiffusion reactions between Al alloy films and Si films are more firmly prevented.

Figure 22A:
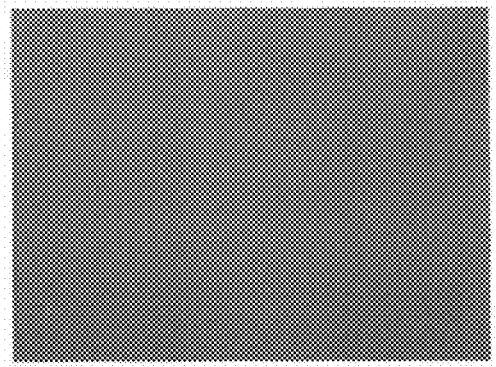
FIGS. 22A and 22B are photographs taken to examine the interfacial diffusion reactions between Al—Ni—Mo films and Si films, showing an example with heat treatment of 300° C. and an example with heat treatment of 350° C.
Figure 22B:
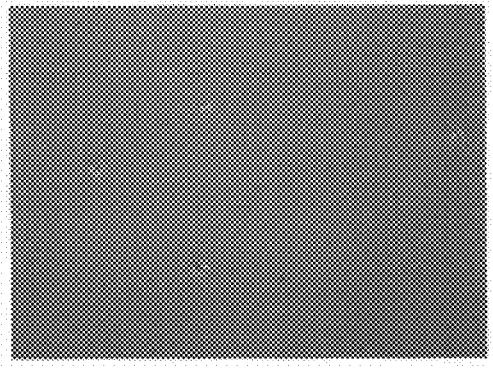
Figure 23A:
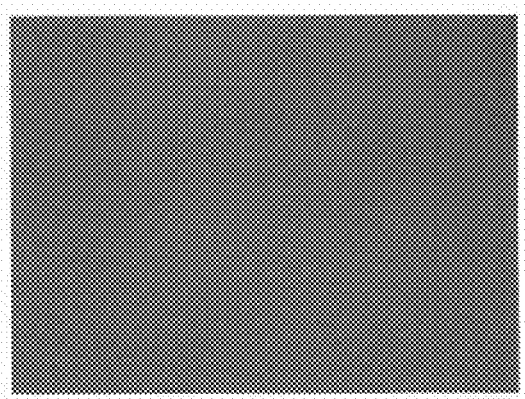
FIGS. 23A and 23B are photographs taken to examine the interfacial diffusion reactions between Al—Ni—W films and Si films, showing an example with heat treatment of 300° C. and an example with heat treatment of 350° C.
Figure 23B:
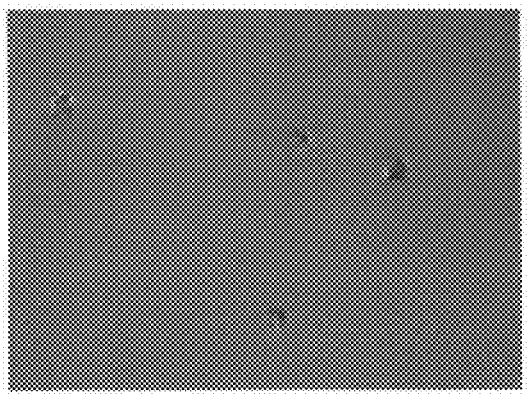
Figure 18:
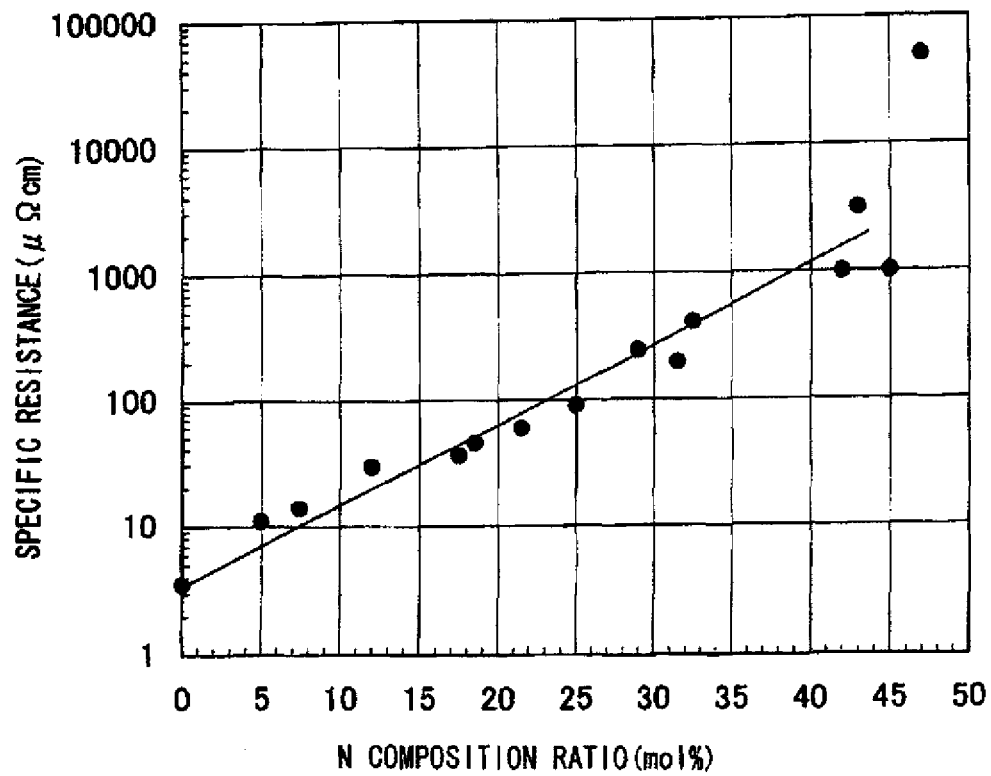
Figure 20:
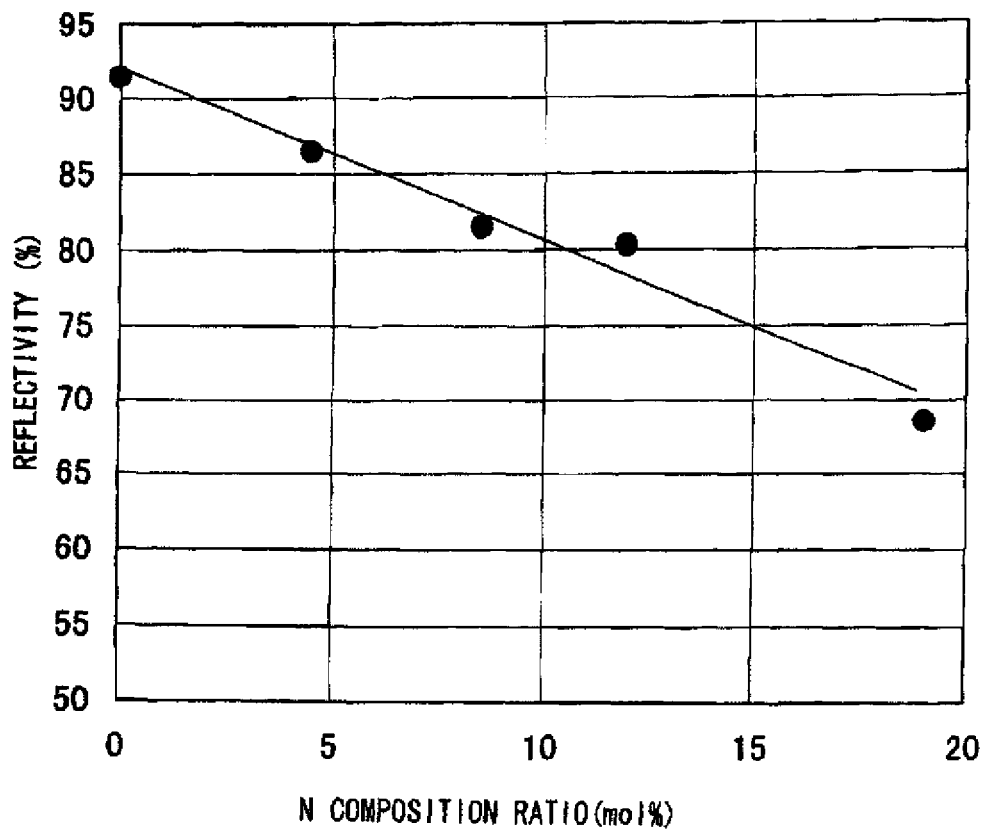

Furthermore, FIGS. 22A and 22B shows the evaluation results of the interfacial diffusions between Al-2 mol % Ni-1 mol % Si films and Si films. The Al-2 mol % Ni-1 mol % Mo films were prepared by adding molybdenum (Mo), which is heavy metal in Period 5 of the periodic table, by 1 mol % as a third additive element to the Al-2 mol % Ni. In particular, FIG. 22A shows the sample subjected to heat treatment of 300° C., and FIG. 22B shows the sample subjected to heat treatment of 350° C. Furthermore, FIGS. 23A and 23B shows the evaluation results of the interfacial diffusions between Al-2 mol % Ni-1 mol % Si films and Si films. The Al-2 mol % Ni-1 mol % W films were prepared by adding tungsten (W), which is heavy metal in Period 6, by 1 mol % as a third additive element. In particular, FIG. 23A shows the sample subjected to heat treatment of 300° C., and FIG. 23B shows the sample subjected to heat treatment of 350° C. In these cases, interdiffusion reactions in spots are not observed in any of the Al alloy films, confirming that they are effective in preventing the diffusions. However, interdiffusion reactions were slightly observed in the case of the heat treatment of 350° C., confirming that the heat treatment is unsatisfactory. Similar diffusion suppressing effects are also observed in the cases where yttrium (Y), zirconium (Zr), niobium (Nb), cerium (Ce), neodymium (Nd), samarium (Sm), gadolinium (Gd), terbium (Tb), dysprosium (Dy), hafnium (Hf), tantalum (Ta), which are also heavy metals in Period 5 or 6 of the periodic table, are used as substitutes. Therefore, it is preferable to add, in addition to Ni, at least one type of element selected from above-listed heavy metals, and to further add N to Al so that interdiffusion reactions between Al alloy films and Si films are more firmly prevented. Furthermore, one of elements explained with FIGS. 21A and 21B, i.e., C, Si, Ge, or Sn may be added in combination with these heavy metals in Period 5 or 6 of the periodic table.

As have been explained so far, Al alloy films capable of achieving excellent contact characteristics when connected to films containing Si as the main ingredients, and methods of manufacturing the same can be provided in accordance with preferable embodiments of the present invention. In this manner, for semiconductor devices that have at least some structure in which an Al alloy film is directly connected to a film containing Si as the main ingredient, excellent contact characteristics between the Al alloy film and the film containing Si as the main ingredient can be achieved without high melting point metal interposed therebetween. In particular, it enables to provide an Al alloy film capable of achieving excellent contact characteristics with an ITO film and a film containing Si as the main ingredient. Therefore, it enables to manufacture semiconductor devices with low cost and high productivity.

Furthermore, when the Al alloy film in accordance with each of the above-described embodiments is applied to the source and drain electrodes and the wirings such as source lines of an active matrix type TFT array substrate for use in a display apparatuses, it can reduce the wiring resistances and form a TFT element having excellent characteristics substantially from Al alloy films alone. Therefore, high display quality display apparatuses can be manufactured with low cost and high productivity without suffering from display unevenness or faulty display caused by signal delays or the likes even in the productions of large display devices or compact high-resolution display devices. In this manner, display devices that require low-resistance wirings can be manufactured with high productivity. Incidentally, the present invention is not limited to above-described embodiments. Those skilled in the art may easily make modifications, additions, and transformations to each component of the above-described embodiments without departing from the scope of the present invention.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor device comprising:
   a film containing Si as a main ingredient; and
   an aluminum alloy film directly connected to the film containing Si as the main ingredient, the aluminum alloy film containing at least Al, Ni, and N in the vicinity of the bonding interface,
   the aluminum alloy film is stacked-layer films including at least:
   a first conducting aluminum alloy film containing at least Ni and N, the first conducting aluminum alloy film being formed by adding N and being directly connected to the film containing Si as the main ingredient; and
   a second aluminum alloy film containing at least Ni, the second aluminum alloy film being formed without adding N and being directly connected to the first aluminum alloy film.

2. The semiconductor device according to claim 1, wherein the film containing Si as the main ingredient is a semiconductor film.

3. The semiconductor device according to claim 1, wherein the film containing Si as the main ingredient is an ohmic low-resistance film of Si containing impurities.

4. The semiconductor device according to claim 1, wherein the aluminum alloy film contains at least Ni and N in the vicinity of the bonding interface and at least the concentration of N decreases with a distance from the bonding interface.

5. The semiconductor device according to claim 1, wherein the aluminum alloy film further contains at least one element from C, Si, Ge, and Sn in the vicinity of the bonding interface.

6. The semiconductor device according to claim 1, wherein the aluminum alloy film further contains at least one element from Y, Zr, Nb, Mo, La, Ce, Nd, Sm, Gd, Tb, Dy, Hf, Ta, or W in the vicinity of the bonding interface.

7. A display device comprising the semiconductor device according to claim 1.

8. The semiconductor device according to claim 1, wherein the film containing Si is an ohmic low-resistance film, and the aluminum alloy film is a drain electrode or a source electrode.

9. The semiconductor device according to claim 1, further comprising:
   a semiconductor active film abutting and adjacent to the film containing Si, the semiconductor active film opposing the aluminum alloy film relative to the film containing Si; and
   an insulating film abutting and adjacent to the aluminum alloy film and the semiconductor active film.

10. The semiconductor device according to claim 1, further comprising:
    a gate electrode;
    a gate insulating film abutting and adjacent to the gate electrode;
    a semiconductor active film abutting and adjacent to the gate insulating film and the film containing Si.

* * * * *

UNITED STATES PATENT AND TRADEMARK OFFICE
CERTIFICATE OF CORRECTION

PATENT NO. : 7,825,515 B2  
APPLICATION NO. : 12/206187  
DATED : November 2, 2010  
INVENTOR(S) : Kazunori Inoue et al.

Page 1 of 3

It is certified that error appears in the above-identified patent and that said Letters Patent is hereby corrected as shown below:

Figure 18, Sheet 17 of 21, "Ni COMPOSITION RATIO (mol %)" should be --N COMPOSITION RATIO (mol %)-- as shown on attached Sheet 17 of 21.

Figure 18, Sheet 17 of 21, "SPESIFIC" should be --SPECIFIC-- as shown on attached Sheet 17 of 21.

Figure 20, Sheet 19 of 21, "Ni COMPOSITION RATIO (mol %)" should be --N COMPOSITION RATIO (mol %)-- as shown on attached Sheet 19 of 21.

Signed and Sealed this  
Eighteenth Day of October, 2011

David J. Kappos  
*Director of the United States Patent and Trademark Office*